United States Patent
Morishita et al.

(10) Patent No.: US 8,798,694 B2
(45) Date of Patent: Aug. 5, 2014

(54) COMMUNICATION DEVICE

(75) Inventors: Katsuji Morishita, Kanagawa (JP);
Mitsuhiro Nishizono, Kanagawa (JP);
Junichi Kondo, Kanagawa (JP)

(73) Assignee: Kyocera Corporation, Kyoto (JP)

(*) Notice: Subject to any disclaimer, the term of this patent is extended or adjusted under 35 U.S.C. 154(b) by 626 days.

(21) Appl. No.: 13/131,642

(22) PCT Filed: Nov. 27, 2009

(86) PCT No.: PCT/JP2009/006441
§ 371 (c)(1),
(2), (4) Date: May 27, 2011

(87) PCT Pub. No.: WO2010/061633
PCT Pub. Date: Jun. 3, 2010

(65) Prior Publication Data
US 2011/0230146 A1  Sep. 22, 2011

(30) Foreign Application Priority Data

Nov. 27, 2008  (JP) .................... 2008-301955
Apr. 24, 2009  (JP) .................... 2009-107102

(51) Int. Cl.
*H04M 1/00* (2006.01)
*H01Q 9/27* (2006.01)
*H01Q 7/00* (2006.01)
*H05K 1/14* (2006.01)
*H01Q 1/24* (2006.01)
*H05K 1/02* (2006.01)
*H04M 1/02* (2006.01)

(52) U.S. Cl.
CPC ............. *H01Q 1/243* (2013.01); *H01Q 9/27* (2013.01); *H01Q 7/00* (2013.01); *H05K 1/148* (2013.01); *H05K 1/028* (2013.01); *H05K 1/0218* (2013.01); *H04M 1/0214* (2013.01); *H05K 2201/0715* (2013.01); *H04M 1/0277* (2013.01)
USPC .......................... 455/575.3; 455/77

(58) Field of Classification Search
USPC ........................................ 455/575.3
See application file for complete search history.

(56) References Cited

U.S. PATENT DOCUMENTS

2004/0253972 A1* 12/2004 Iwai et al. ............. 455/550.1
2009/0181732 A1*  7/2009 Isoda et al. ............ 455/575.3
2009/0264166 A1* 10/2009 Kobayashi ............. 455/575.3

FOREIGN PATENT DOCUMENTS

JP  2002-335180 A  11/2002
JP  2004-172919 A   6/2004

(Continued)

OTHER PUBLICATIONS

International Search Report of PCT/JP2009/006441, mailed on Mar. 2, 2010.

*Primary Examiner* — Wen Huang
(74) *Attorney, Agent, or Firm* — Hoffmann & Baron, LLP

(57) ABSTRACT

A communication device is capable of extending a power supply unit to a second casing without additional components. A mobile telephone includes a circuit board disposed at an operation unit-side casing, a circuit board disposed at a display unit-side casing, a circuit part formed on the circuit board having a ground pattern and a contact point, a reference potential pattern layer disposed at the operation unit-side casing and electrically connected to the ground pattern, a reference potential pattern layer disposed at the display unit-side casing, and an FPC unit. The FPC unit includes a signal line and a shield layer. The shield layer is electrically connected to the contact point in the operation unit-side casing and is thus electrically connected to the reference potential pattern layer in the display unit-side casing.

15 Claims, 18 Drawing Sheets

(56) References Cited

FOREIGN PATENT DOCUMENTS

| | | |
|---|---|---|
| JP | 2004-214726 A | 7/2004 |
| JP | 2005-354552 A | 12/2005 |
| JP | 2006-50056 A | 2/2006 |
| JP | 2006-508624 A | 3/2006 |
| JP | 2006-238271 A | 9/2006 |
| JP | 2006-311449 A | 11/2006 |
| JP | 2007-89123 A | 4/2007 |
| JP | 2007-201918 A | 8/2007 |
| JP | 2007-306347 A | 11/2007 |
| JP | 2008-227560 A | 9/2008 |
| WO | 2006-046712 A1 | 5/2006 |
| WO | 2007-138682 A1 | 12/2007 |
| WO | 2008-004479 A1 | 1/2008 |

* cited by examiner

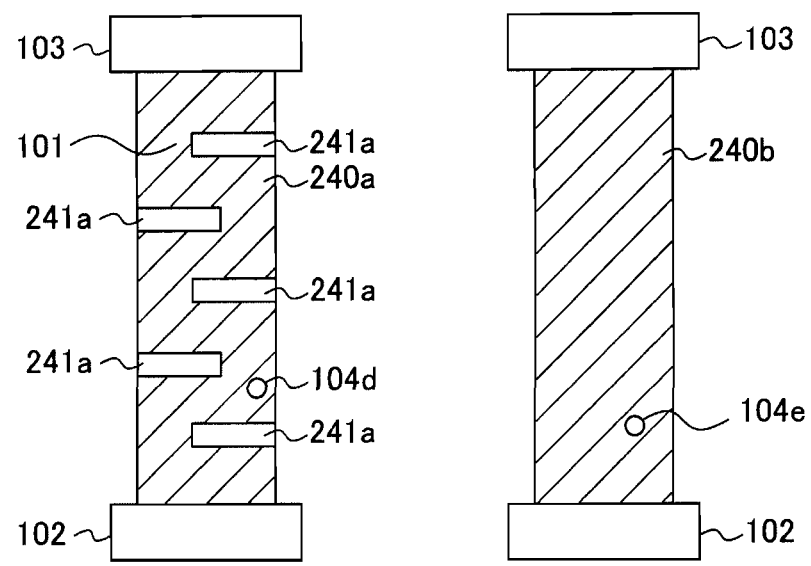

COMMUNICATION DEVICE

CROSS-REFERENCE TO RELATED APPLICATIONS

This application is the National Stage of International Application No. PCT/JP2009/006441, which designates the U.S., filed Nov. 27, 2009 which claims the benefit of JP 2009-107102, filed Apr. 24, 2009 and JP 2008-301955, filed Nov. 27, 2008, the contents of which are incorporated by reference herein.

TECHNICAL FIELD

The present invention relates to a communication device in which a plurality of bodies is connected.

BACKGROUND ART

Conventionally, technologies for reducing in size and thinning an antenna that receives wireless signals have been proposed in response to demands for reducing in size and thinning communication devices such as cellular telephone devices and the like.

For example, a communication device has been proposed that allows a display unit side housing and a operation unit side housing to move relatively via a connection portion and allows circuit boards arranged in each of the display unit side housing and the operation unit side housing to function as an antenna and a ground and to operate as a dipole antenna.

Furthermore, technology has been proposed to obtain high gain antenna characteristics in such a communication device (for example, see Japanese Unexamined Patent Application, Publication No. 2002-335180).

Japanese Unexamined Patent Application, Publication No. 2002-335180 discloses that a flexible printed circuit (hereinafter, referred to as FPC) is connected to a shield box of a display unit side housing (a second housing) and power is fed to the shield box of the display unit side housing. Furthermore, it discloses a communication device that allows the shield box of the display unit side housing and a ground pattern on the circuit board having the ground potential of the operation unit side housing (a first housing) to function as a dipole antenna.

Patent Document 1: Japanese Unexamined Patent Application Publication No. 2002-335180

DISCLOSURE OF THE INVENTION

Problems to be Solved by the Invention

Here, it is necessary to include an additional configuration in order to extend an power feed portion to the second housing in the communication device disclosed in Japanese Unexamined Patent Application, Publication No. 2002-335180. However, in view of the requirement of minimizing a communication device, such a configuration of extending the power feed portion is not preferable.

Thus, it is an object of the present invention to provide a communication device that can extend an power feed portion to a second housing without requiring an additional configuration.

Means for Solving the Problems

In order to solve the abovementioned objects, a communication device according to the present invention includes: a first housing; a second housing; a first circuit board disposed in the first housing; a second circuit board disposed in the second housing; a circuit portion that is formed on the first circuit board, and includes a grounding portion, an power feed portion, and a signal processing unit electrically connected to the power feed portion; a first conductive portion that is disposed in the first housing and is electrically connected with the grounding portion; a second conductive portion that is disposed in the second housing; and a signal line that electrically connects the first circuit board with the second circuit board, in which the signal line includes a signal transmission unit that transmits a predetermined signal and a shield portion that shields the signal transmission unit electrically, and in which the shield portion is electrically connected with the power feed portion in the first housing and is electrically connected with the second conductive portion in the second housing.

Furthermore, it is preferable that, in the communication device, the shield portion has a plurality of contact points, and the communication device further includes: a first selector unit that is configured to be able to select a connection state electrically connecting one contact point among the plurality of contact points with the power feed portion; and a first control unit that controls selection of the connection state by the first selector unit.

Furthermore, it is preferable that the communication device further includes: a connection unit that connects the first housing with the second housing to be relatively movable; and a detection unit that detects a relative movement state of the first housing and the second housing via the connection unit, in which the first control unit controls selection of the connection state by the first selector unit in accordance with the relative movement state of the first housing and the second housing detected by the detection unit.

Furthermore, it is preferable that the the detection unit detects a closed state in which the first housing and the second housing are arranged to overlap each other, an opened state in which the first housing and the second housing are arranged not to overlap each other, and an intermediate state between the closed state and the opened state, as the relative movement state.

Furthermore, it is preferable that the communication device further includes a function executing unit that executes a function based on a signal resonated by the second conductive portion, in which the first control unit controls selection of the connection state by the first selector unit in accordance with a frequency of a signal resonated by the second conductive portion and is a basis for a function executed by the function executing unit.

It is preferable that the function executing unit includes a tuner unit and a decoder unit, the tuner unit receives a signal resonated by the second conductive portion as a broadcast wave, and the decoder unit decodes the broadcast wave received by the tuner unit.

Furthermore, it is preferable that, in the communication device, the length of the first conductive portion in the length direction of the first housing is substantially the same as the length obtained by the sum of the length of the second conductive portion in the length direction of the second housing and the length of a transmission path in the shield portion through which a signal resonated by the second conductive portion passes through.

Furthermore, it is preferable that, in the communication device, the first conductive portion is a first reference electric potential pattern that is formed on the first circuit board.

Furthermore, it is preferable that, in the communication device, the second conductive portion is a second reference electric potential pattern that is formed on the second circuit board.

Furthermore, it is preferable that, in the communication device, the signal line includes a first shield portion and a second shield portion that sandwiches the signal transmission unit, and the first shield portion and the second shield portion are electrically connected with the power feed portion in the first housing, and are electrically connected with the second conductive portion in the second housing.

Furthermore, it is preferable that, in the communication device, the first shield portion is configured in a first shape that resonates with a first frequency band, and the second shield portion is configured in a second shape that resonates with a second frequency band.

Furthermore, it is preferable that, in the communication device, the communication device further includes a second selector unit that is configured so as to be able to select either one of a first state in which the first shield portion is electrically connected with the power feed portion in the first housing and is electrically connected with the second conductive portion in the second housing, and a second state in which the second shield portion is electrically connected with the power feed portion in the first housing and is electrically connected with the second conductive portion in the second housing.

Furthermore, it is preferable that, in the communication device, the signal transmission unit includes a signal transmission line that transmits a signal and a ground line that is electrically connected with a reference electric potential, and the shield portion is electrically connected with the power feed portion proximal to the ground line in the first housing.

Furthermore, it is preferable that, in the communication device, a groove with a predetermined depth is formed in the shield portion to correspond to a location between the signal transmission line and the ground line.

Furthermore, it is preferable that, in the communication device, the signal transmission unit includes a first signal transmission line that transmits a signal at a first transmission rate and a second signal transmission line that transmits a signal at a second transmission rate that is faster than the first transmission rate, and the shield portion is electrically connected with the power feed portion more proximal to the first signal transmission line than to the second signal transmission line in the first housing.

Furthermore, it is preferable that, in the communication device, a groove with a predetermined depth is formed in the shield portion to correspond to a location between the first signal transmission line and the second signal transmission line.

Effects of the Invention

According to the present invention, it is possible to provide a communication device capable of extending an power feed portion to a second housing without the need for additional components.

BRIEF DESCRIPTION OF THE DRAWINGS

FIG. 16 is a view illustrating a configuration example of a FPC unit 101 according to a sixth embodiment;

PREFERRED MODE FOR CARRYING OUT THE INVENTION

Figure 1:
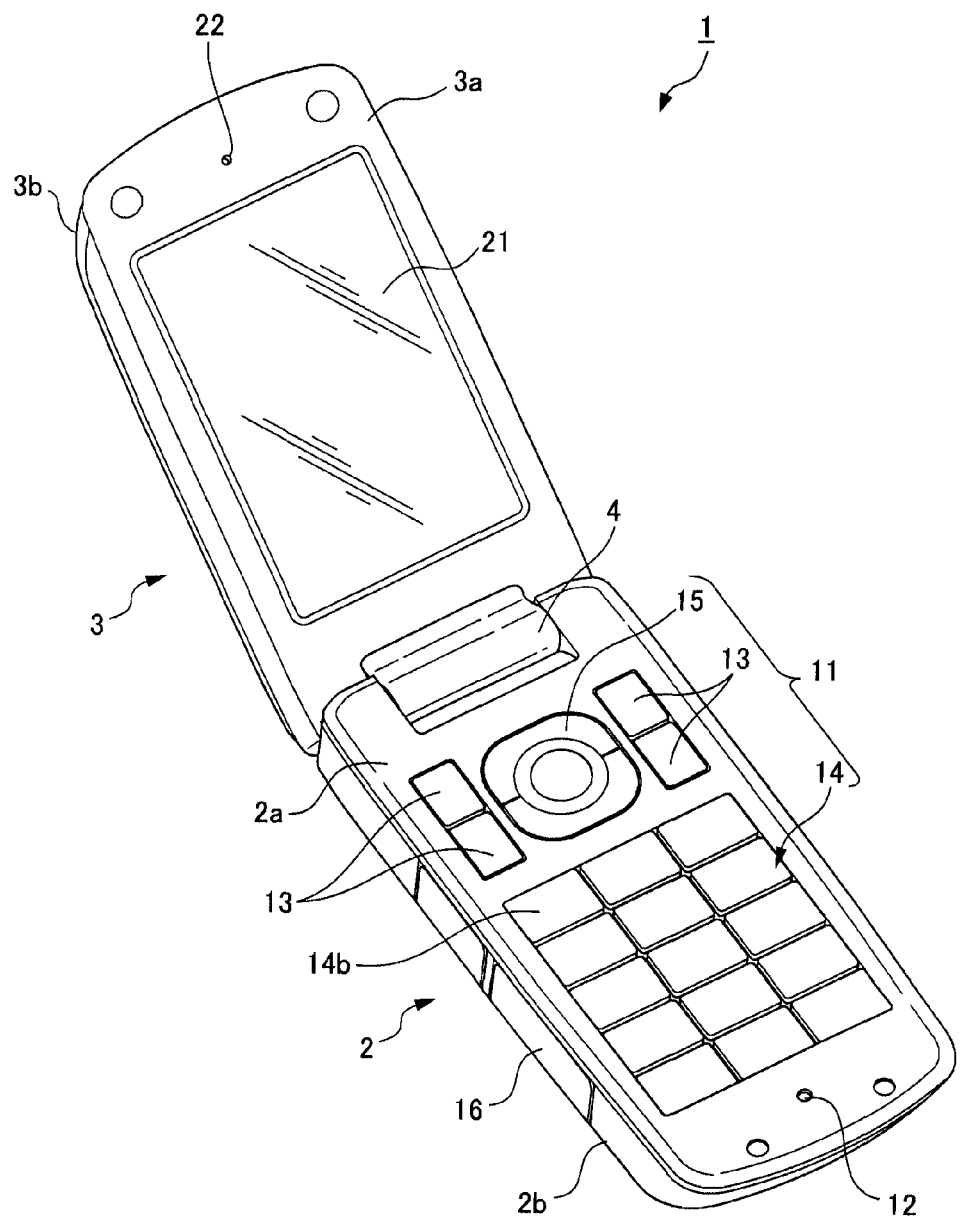
FIG. 1 is a perspective view of an outer appearance of a cellular telephone device being opened.

Hereafter, the best modes for implementing the present invention with reference to the drawings are explained. A basic structure in the cellular telephone device 1 as an electric apparatus will be described with reference to FIG. 1. FIG. 1 shows a perspective view of an outer appearance in a state in which the cellular telephone device 1 is opened.

As shown in FIG. 1, the cellular telephone device 1 includes a operation unit side housing 2 as a housing and a display unit side housing 3. The operation unit side housing 2 (a first housing) and the display unit side housing 3 (a second housing) are connected such that the opening and closing thereof are possible via a connection portion 4 having a hinge mechanism. Specifically, an upper end portion of the operation unit side housing 2 and a lower end portion of the display unit side housing 3 are connected via the connection portion 4. Thereby, the cellular telephone device 1 is configured such that it is possible to move the operation unit side housing 2 and the display unit side housing 3, which are connected via the hinge mechanism, relatively with each other. That is, the cellular telephone device 1 can be in a state (opened state) where the operation unit side housing 2 and the display unit side housing 3 are opened, and a state (closed state) where the operation unit side housing 2 and the display unit side housing 3 are in a folded state. Here, a closed state means a state where both housings are arranged to overlap with each other, and an opened state means a state where both housings are arranged not to overlap with each other.

An outer surface of the operation unit side housing 2 is configured with a front case 2a and a rear case 2b. The operation unit side housing 2 is configured so that, at its front case 2a side, a operation key group 11, and a voice input unit 12 as a microphone to which voice produced by the user of the cellular telephone device 1 are respectively exposed.

The operation key group 11 is configured with a function setting operation key 13 for bringing various functions such as various settings, a telephone directory function, a mail function, and the like, and an input operation key 14 for inputting numbers of a telephone number, characters of mail and the like, for example, and a determination operation key 15, which is an operation member that performs determination in various operations, scrolling in up, down, left and right directions, and the like. A predetermined function is assigned to each key constituting the operation key group 11 according to the opening or closing state of the operation unit side housing 2 and the display unit side housing 3, various modes, type of application running, or the like (key assigning). Then, when the user presses the keys, an operation is executed according to the function assigned to each key.

The voice input unit 12 is arranged at an outer end portion side opposite to the connection portion 4 side in the longitudinal direction of the operation unit side housing 2. That is, the voice input unit 12 is arranged at the outer end portion side of one side when the cellular telephone device 1A is in the opened state.

On a side face of one side of the operation unit side housing 2, an interface (not illustrated) for communicating with external devices (for example, a host device) is arranged. On a side face of the other side of the operation unit side housing 2, a side key to which a predetermined function is assigned, and an interface (not illustrated) with which insertion and removal of an external memory are performed are arranged. The interface is covered with a cap. Each interface is covered with a cap when not in use.

An outer surface of the display unit side housing 3 is configured by a front panel 3a, a front case 3b, a rear case 3c, and a rear panel 3d. A display 21 for displaying a variety of information and a voice output unit 22, which is a receiver that outputs voice of the other party of a call are arranged at the display unit side housing 3 so that they are exposed. The display 21 is configured by a liquid crystal panel, a drive circuit which drives this liquid crystal panel, and a light source unit such as a back light, which radiates light from a back side of this liquid crystal panel.

Figure 2:
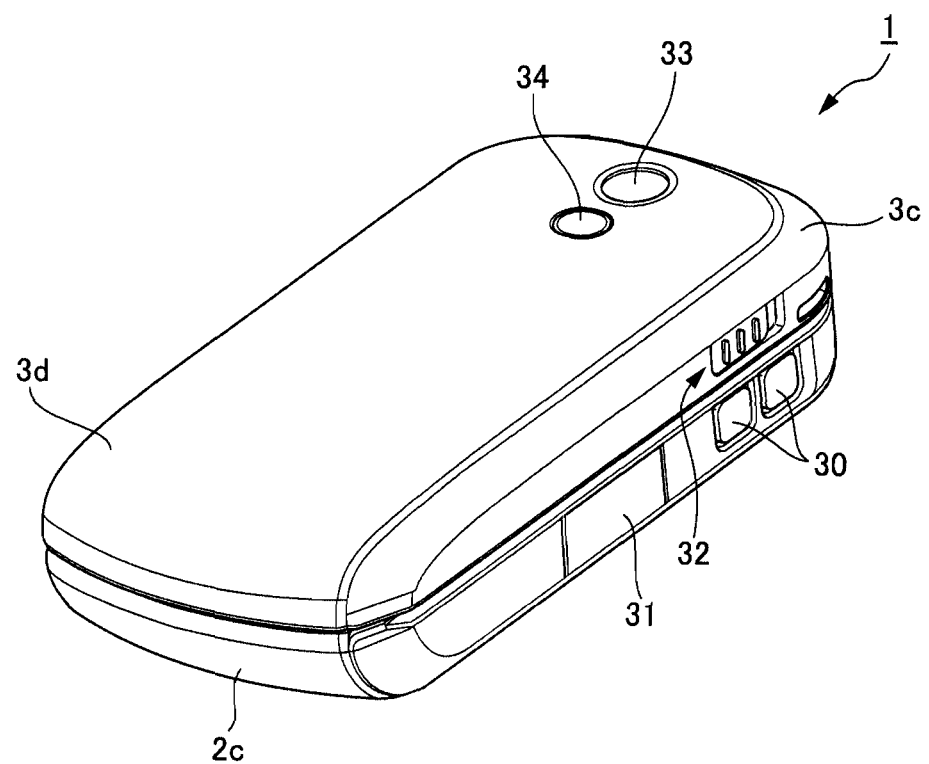
FIG. 2 is a perspective view of a folded state of the cellular telephone device.

Furthermore, FIG. 2 is a perspective view of a folded state of the cellular telephone device 1. The operation unit side housing 2 includes on one side face a side key 30 to which a predetermined function is assigned and a cap 31 used for an interface with which insertion and removal of external memory are performed. Furthermore, the display unit side housing 3 is formed so that a camera 33 that captures an image of an object and a light 34 that radiates light to the object are exposed on a surface of the rear panel 3d of the display unit side housing 3.

Figure 3:
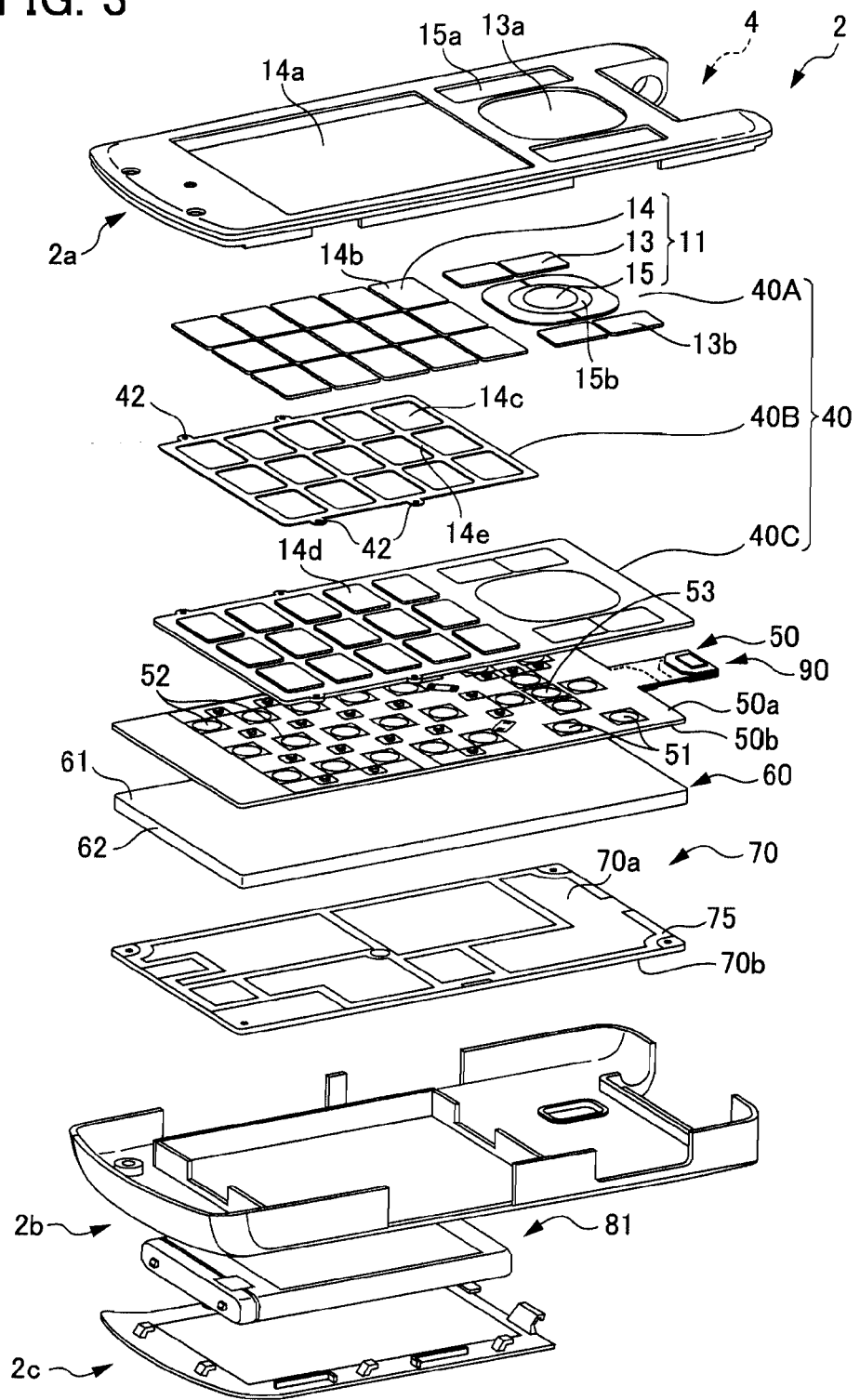
FIG. 3 is an exploded perspective view of a member embedded in a operation unit side housing.

FIG. 3 is an exploded perspective view of a member embedded in the operation unit side housing 2. As shown in FIG. 3, the operation unit side housing 2 includes a front case 2a, a key structure portion 40, a key substrate 50, a case housing 60, a circuit board 70 (a first circuit board) including various electronic parts such as a reference electric potential pattern layer 75 (a first conductive portion) that is electrically connected to a grounding portion on an RF (Radio Frequency) circuit portion 106 (described later) and an RF module for a cellular telephone device, a rear case 2b including a battery lid 2c, and a battery 81. The key substrate 50 and a circuit board 70 are electrically connected by way of an FPC unit 90 as a board extending from the key substrate 50. Furthermore, the RF circuit portion 106 (circuit portion) that includes an power feed portion that feeds power or to which power is fed and the grounding portion that is electrically connected to a reference electric potential and that performs processing of high-frequency signals is mounted on the circuit board 70.

The front case 2a and the rear case 2b are arranged so that their concave-shaped internal surfaces face each other and their outer circumferential edges overlap each other. In addition, a key structure portion 40, a key substrate 50 including the FPC unit 90, a case housing 60, and a circuit board 70 are housed between the front case 2a and the rear case 2b so as to be sandwiched therebetween.

Key holes 13a, 14a, and 15a are formed in the front case 2a on an internal surface that faces the display 21 of the display unit side housing 3 in a state where the cellular telephone device 1 is folded together. From each of the key holes 13a, 14a and 15a, a pressing surface of the function setting operation key member 13b constituting the function setting operation key 13, a pressing surface of the input operation key member 14b constituting the input operation key 14, and a pressing surface of the determination operation key member 15b constituting the determination operation key 15 are exposed. By pressing the pressing surfaces of thus exposed function setting operation key member 13b, input operation key member 14b, and determination operation key member 15b, the top of a metal dome (bowl-shaped), which is described later, provided at each of the corresponding key switches 51, 52, and 53 is pressed and contacts a switch terminal to be electrically conducted to it.

The key structure portion 40 is configured with an operation member 40A, a key frame 40B as a reinforcement member, and a key seat 40C as a sheet member.

The operation member 40A is configured with a plurality of key operation members. Specifically, it is configured with a function setting operation key member 13b, an input operation key member 14b, and a determination operation key member 15b. Each of the operation key members constituting the operation member 40A is adhered to the key seat 40C by sandwiching the key frame 40B described later. The pressing surface on each of the operation key members adhered to the key seat 40C is arranged to be exposed outside from each of the key holes 13a, 14a and 15a, as described above.

The key frame 40B is a metallic plate-shaped member in which a plurality of hole portions 14c are formed. The key frame 40B is a reinforcement member for preventing adverse effects to the circuit board 70 or the like due to pressing of the input operation key member 14b. In addition, the key frame 40B is an electrically conductive member, and functions also as a member for releasing static electricity in the input operation key member 14b. Convex portions 14d formed on the key seat 40C described later are arranged to fit to a plurality of hole portions 14c formed in the key frame 40B. Then, the input operation key members 14b adheres to the convex portions 14d.

The key seat 40C is a sheet-shaped member made of silicone rubber having flexibility. A plurality of convex portions 14d are formed in the key seat 40C as described above. The plurality of convex portions 14d are formed on a surface of the key seat 40C on a side where the key frame 40B is to be arranged. Each of the plurality of convex portions 14d is formed at a position corresponding to the key switch 52 described later.

The key substrate 50 has a plurality of key switches 51, 52 and 53 arranged on a first surface 50a which is a surface of the key seat 40C side. Each of the plurality of key switches 51, 52 and 53 are arranged at a position corresponding to each operation member 40A. The key switches 51, 52 and 53 arranged at the key substrate 50 have structures that have metal domes of metallic plates three-dimensionally formed so as to have a curved bowl shape. The metal dome is configured so that when the top of its bowl shape is pressed, it contacts the switch terminal formed on an electrical circuit (not illustrated) printed on the surface of the key substrate 50 and conducts electrically. Furthermore, a plurality of electric wires is formed at a second surface 50b side of the key substrate 50.

Figure 4:
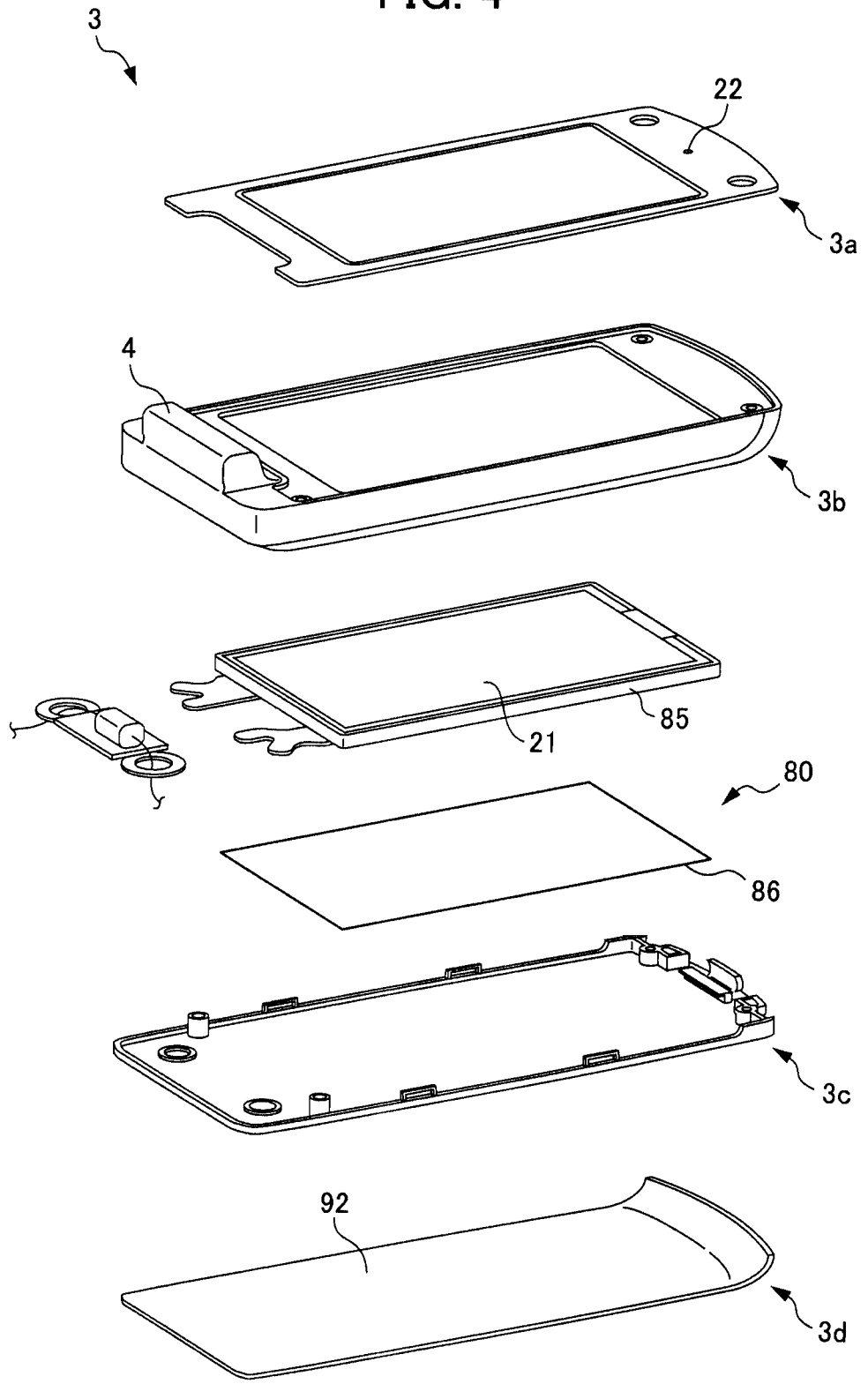
FIG. 4 is an exploded perspective view of a member embedded in a display unit side housing.

FIG. 4 is an exploded perspective view of a member embedded in the display unit side housing 3. As shown in FIG. 4, the display unit side housing 3 includes a front panel 3a, a front case 3b, a connection portion 4, a display 21, a circuit board 80 (a second circuit board) to which the display 21 is connected, a rear case 3c, and rear panel 3d. Furthermore, at the display unit side housing 3, the front panel 3a, the front case 3b, the display 21, the circuit board 80, the rear case 3c, and the rear panel 3d are arranged in a stacked manner.

As shown in FIG. 4, the front case 3b and the rear case 3c are arranged so that their concave internal surfaces face each other, and they are joined together so that their outer circumferential edges overlap with each other. Furthermore, the display 21 and the circuit board 80 are sandwiched between the front case 3b and the rear case 3c and are housed therein. In addition, a reference electric potential pattern layer 86 (a second conductive portion) is formed on the circuit board 80.

Furthermore, in the cellular telephone device 1, the circuit board 80 provided inside the display unit side housing 3 is electrically connected with the circuit board 70 provided inside the operation unit side housing 2 by way of a flexible print circuits (hereinafter, referred to as FPC) between the operation unit side housing 2 and the display unit side housing 3.

First Embodiment

Figure 5:
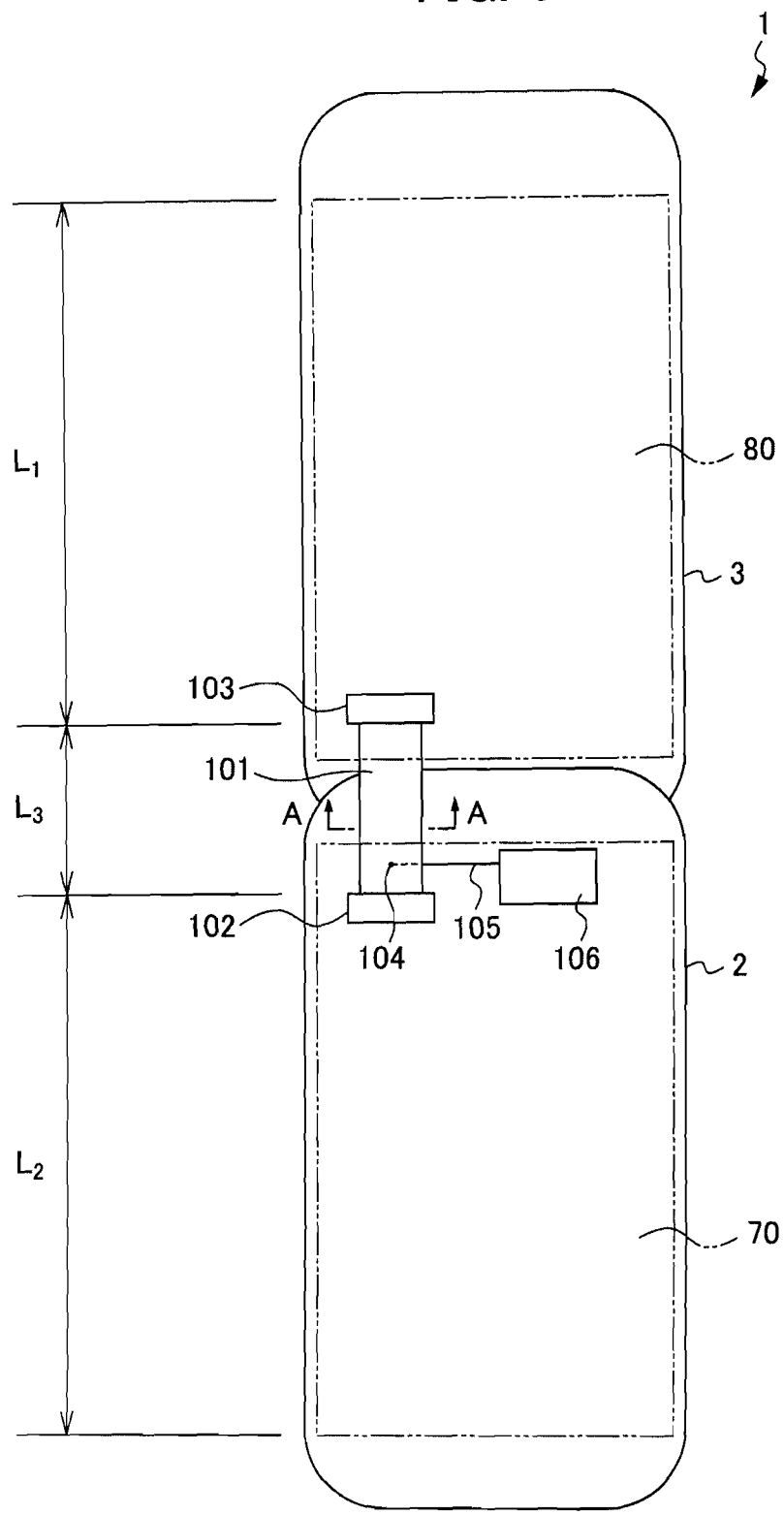
FIG. 5 is a view illustrating an internal structure of the cellular telephone device in an opened state according to a first embodiment.

FIG. 5 is a view illustrating an internal structure of the cellular telephone device 1 in an opened state according to a first embodiment. As shown in FIG. 5, the circuit board 70 and the circuit substrate 80 are electrically connected with each other by way of the FPC unit 101. More specifically, an FPC connector 102 is arranged at an end portion of the circuit board 70 on a operation unit side housing 2 side thereof and an FPC connector 103 is arranged at an end portion of the circuit board 80 of the display unit side housing 3 side. Then, the FPC unit 101 is inserted to the FPC connectors 102 and 103 so as to electrically connect the circuit board 70 with the circuit board 80.

Furthermore, a contact point 104 is provided at the FPC unit 101, which is located at the circuit board 70 side, and is electrically connected with the RF circuit portion 106 via a signal line 105.

Figure 6:
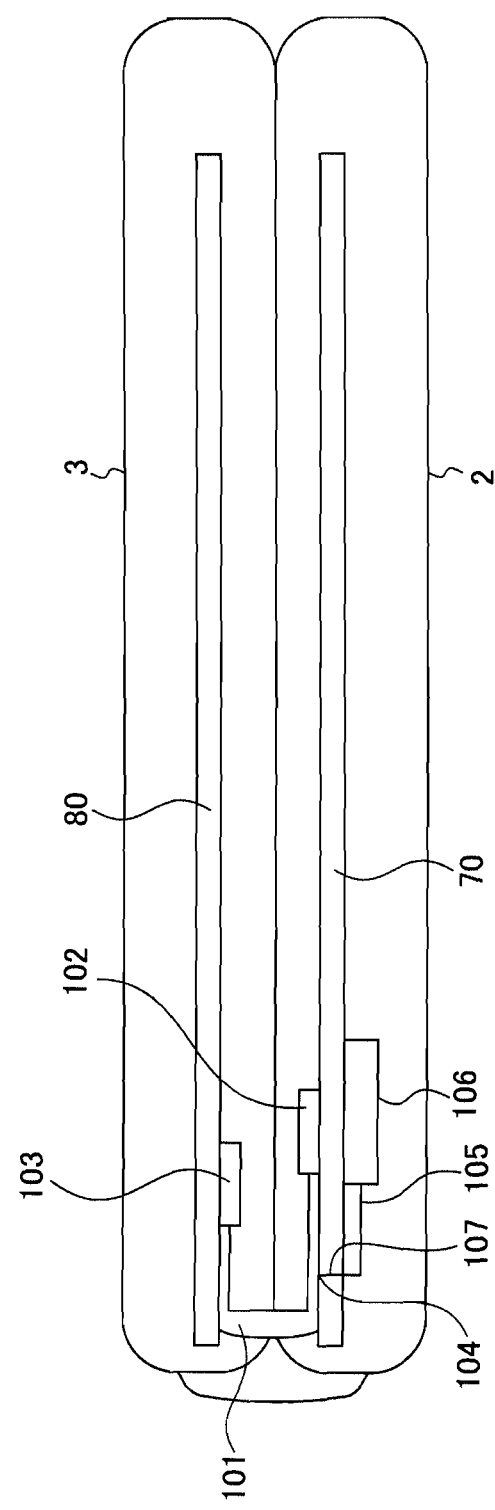
FIG. 6 is a view illustrating a conductive structure of an FPC unit and an power feed point in a closed state of the cellular telephone device according to the first embodiment.

FIG. 6 is a view illustrating a conductive structure of the FPC unit 101 and the contact point 104 of the cellular telephone device 1 in a closed state according to the first embodiment. As shown in FIG. 6, the RF circuit portion 106 is mounted on a side opposite to the side on which the FPC connector 102 is arranged. Furthermore, an opening portion 107 is formed on the circuit board 70. Then, the contact point 104 is provided at the FPC unit 101 (a shield layer 204 or a shield layer 260 as described later) and is connected to the power feed portion of the RF circuit portion 106 by the signal line 105 through the opening portion 107. In this way, the contact point 104 has a function of supplying electric power from the power feed portion or as an power feed point supplying electric power.

Figure 7:
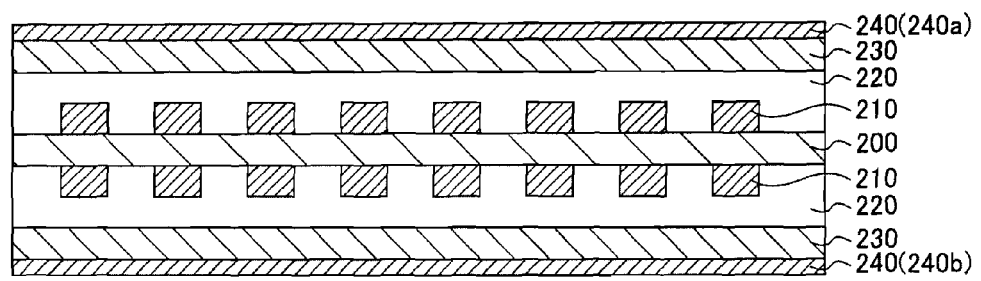
FIG. 7 is a view illustrating an internal structure of the FPC unit.
Figure 8:
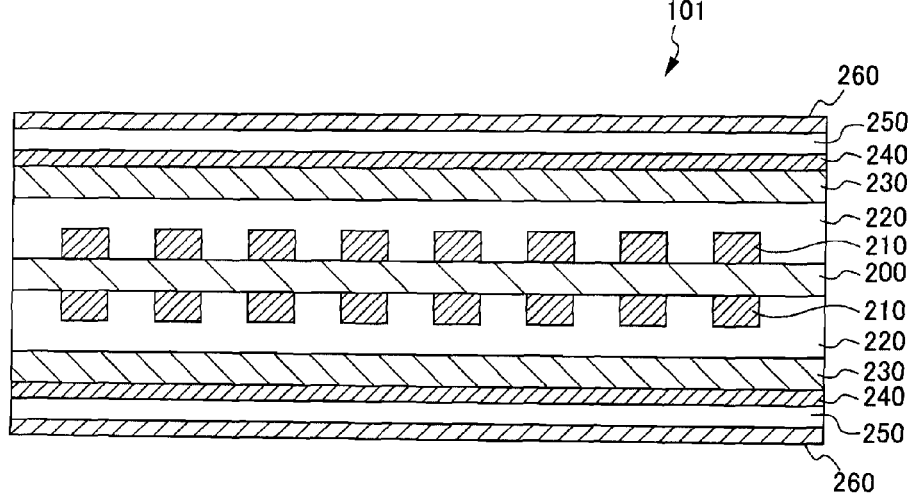
FIG. 8 is a view illustrating an internal structure of the FPC unit.

FIGS. 7 and 8 are views illustrating a cross section of the FPC unit 101 along a line A-A, and configuration examples of the internal structure of the FPC unit 101. It should be noted that, in FIGS. 7 and 8, since the structure of the FPC unit 101 is a line-symmetric shape with respect to a center line in a thickness direction of the FPC unit 101, explanations for the upper surface side thereof are mainly made and explanations for the lower surface side thereof are omitted.

FIG. 7 is a view illustrating an internal structure of the FPC unit 101. As shown in FIG. 7, the FPC unit 101 includes a base material 200, a plurality of signal wires 210 (a signal transmission unit) formed on the base material 200, an insulation layer 220, a conductive adhesive layer 230, and a shield layer 240 (a shield portion).

The signal wires 210 transmit a display signal of the display 21 and a receiver signal as predetermined signals. The insulation layer 220 is formed on the signal wires 210. The conductive adhesive layer 230 bonds the insulation layers 220 and the shield layers 240.

The shield layer 240 electrically shields the signal wires 210. Furthermore, the shield layer 240 is electrically connected to the contact point 104 at the operation unit side housing 2. Moreover, the shield layer 240 is electrically connected to the reference electric potential pattern layer 86, which is a second conductive portion, at the display unit side housing 3. As a result, power is fed to the reference electric potential pattern layer 86 from the power feed portion of the RF circuit portion 106 via the contact point 104 or the reference electric potential pattern layer 86 feeds power to the power feed portion of the RF circuit portion 106 via the contact point 104.

Herein, transmission of noise signals in the FPC unit 101 shown in FIG. 7 and transmission of radio signals from outside are explained. Firstly, a display signal of the display 21, a receiver signal, and the like, transmit through the signal wires 210. Furthermore, the electric field of the noise from the signal wires 210 reaches a surface of the base material 200 side of the conductive adhesive layer 230 proximal to the signal wires 210, and thus, electric current flows to a surface of the conductive adhesive layer 230 on the base material 200 side thereof due to the skin effect.

On the other hand, the radio signals from outside reach a surface of the shield layer 240, and thus, electric current flows to an outer surface of the shield layer 240 (a surface opposite to the surface of the base material 200) due to the skin effect. In this way, the FPC unit 101 can suitably isolate the noise from the signal wires 210 from the radio signals from outside.

Furthermore, FIG. 8 is a view illustrating another configuration example of the internal structure of the FPC unit 101.

As shown in FIG. 8, the FPC unit 101 includes a base material 200, a plurality of signal wires 210 (a signal transmission unit) formed on the base material 200, an insulation layer 220, a conductive adhesive layer 230, a shield layer 240, an insulation layer 250, and a shield portion 260 (shield portion). The FPC unit 101 shown in FIG. 8 is different from the FPC unit 101 shown in FIG. 7 in that the former includes the insulation layer 250 and the shield layer 260.

The insulation layer 250 is formed on the shield layer 240 and electrically isolates the shield layer 240 from the shield layer 260.

The conductive adhesive layer 230 and the shield layer 260 electrically shield the signal wires 210. Furthermore, the shield layer 260 is electrically connected to the contact point 104 at the operation unit side housing 2. Moreover, the shield layer 260 is electrically connected to the reference electric potential pattern layer 86, which is a second conductive portion, at the display unit side housing 3. As a result, power is fed to the reference electric potential pattern layer 86 from the power feed portion of the RF circuit portion 106 via the contact point 104 or the reference electric potential pattern layer 86 feeds power to the power feed portion of the RF circuit portion 106 via the contact point 104.

Here, transmission of a radio signal from outside at the FPC unit 101 shown in FIG. 8 will be explained. The radio signal from outside reaches a surface of the shield layer 260, and thus, electric current flows to an outer surface of the shield layer 260 (a surface opposite to the surface of the base material 200) due to the skin effect. Since the FPC unit 101 shown in FIG. 8 is provided with the insulation layer 250 on the shield layer 240 in this way, it is possible to suitably isolate the noise from the signal wires 210 from the radio signals from outside. It should be noted that, in the following descriptions, a case in which the shield layer 240 shown in FIG. 7 is used as a shield portion will be explained; however, a case in which the shield layer 260 shown in FIG. 8 is used as a shield portion can also exert similar operations and effects.

Furthermore, as described above, the reference electric potential pattern layer 75 as the first conductive portion is formed on the circuit board 70. The reference electric potential pattern layer 75 is connected to the grounding portion of the RF circuit portion 106 that is mounted to the circuit board 70. Furthermore, the reference electric potential pattern layer 86 as the second conductive portion is formed at the circuit board 80, and power is fed to the reference electric potential pattern layer 86 from the power feed portion of the RF circuit portion 106 via the contact point 104 or the reference electric potential pattern layer 86 feeds power to the power feed portion of the RF circuit portion 106 via the contact point 104.

In this way, the reference electric potential pattern layer 75 functions as a grounding portion and the shield layer 240 and the reference electric potential pattern layer 86 functions as an antenna element, a result of which the reference electric potential pattern layer 75 and the reference electric potential pattern layer 86 function as a dipole antenna.

Furthermore, in this case, as shown in FIG. 5, it is preferable for a length L2 of the reference electric potential pattern layer 75 to be substantially the equal to the length L1+L3, which is sum total length of the length L1 of the reference electric potential pattern layer 86 that operates as an antenna element and the length L3 of the FPC unit 101 (shield layer 240).

As described above, according to the cellular telephone device 1 of the present embodiment, the shield layer 240 electrically shields the signal wires 210. Furthermore, the shield layer 240 is electrically connected to the contact point 104 at the operation unit side housing 2. Moreover, the shield layer 240 is electrically connected to the reference electric potential pattern layer 86, which is a second conductive portion, at the display unit side housing 3. Therefore, the reference electric potential pattern layer 86 and the contact point 104 are electrically connected via the shield layer 240 of the FPC unit 101. Accordingly, it is possible to extend the wiring to the display unit side housing 3 by providing an additional power feed line other than the signal wires 210, so that it is possible to achieve simplification of the wiring structure of the FPC unit 101 and the connection portion 4. Consequently, simplification of the structure is also achieved for the cellular telephone device 1 overall.

Furthermore, according to the cellular telephone device 1 of the present embodiment, the length L2 of the reference electric potential pattern layer 75 that operates as the grounding portion becomes substantially the same as the length L1+L3, which is the sum total length of the length L1 of the reference electric potential pattern layer 86 that operates as an antenna element and the length L3 of the FPC unit 101 (shield layer 240). Therefore, for the cellular telephone device 1, it is possible to achieve optimization of the antenna characteristics of the reference electric potential pattern layer 75 and the reference electric potential pattern layer 86 and the FPC unit 101, which operate as a dipole antenna.

Furthermore, according to the cellular telephone device 1 of the present embodiment, the first conductive portion is the reference electric potential pattern layer 75 formed on the circuit board 70. As a result, it is possible to achieve effective utilization of the circuit board 70 and realize a size reduction in the operation unit side housing 2.

Furthermore, according to the cellular telephone device 1 of the present embodiment, the second conductive portion is the reference electric potential pattern layer 86 formed on the circuit board 80. As a result, it is possible to achieve effective utilization of the circuit board 80 effectively and realize a size reduction in the display unit side housing 3, Second Embodiment Next, a second embodiment according to the present invention will be explained with reference to FIGS. 9 to 12. In the following, the points in which a cellular telephone device 1 according to the second embodiment differs from the cellular telephone device 1 according to the first embodiment are mainly described, and those for similar configurations and operations therebetween are abbreviated or omitted.

Figure 9:
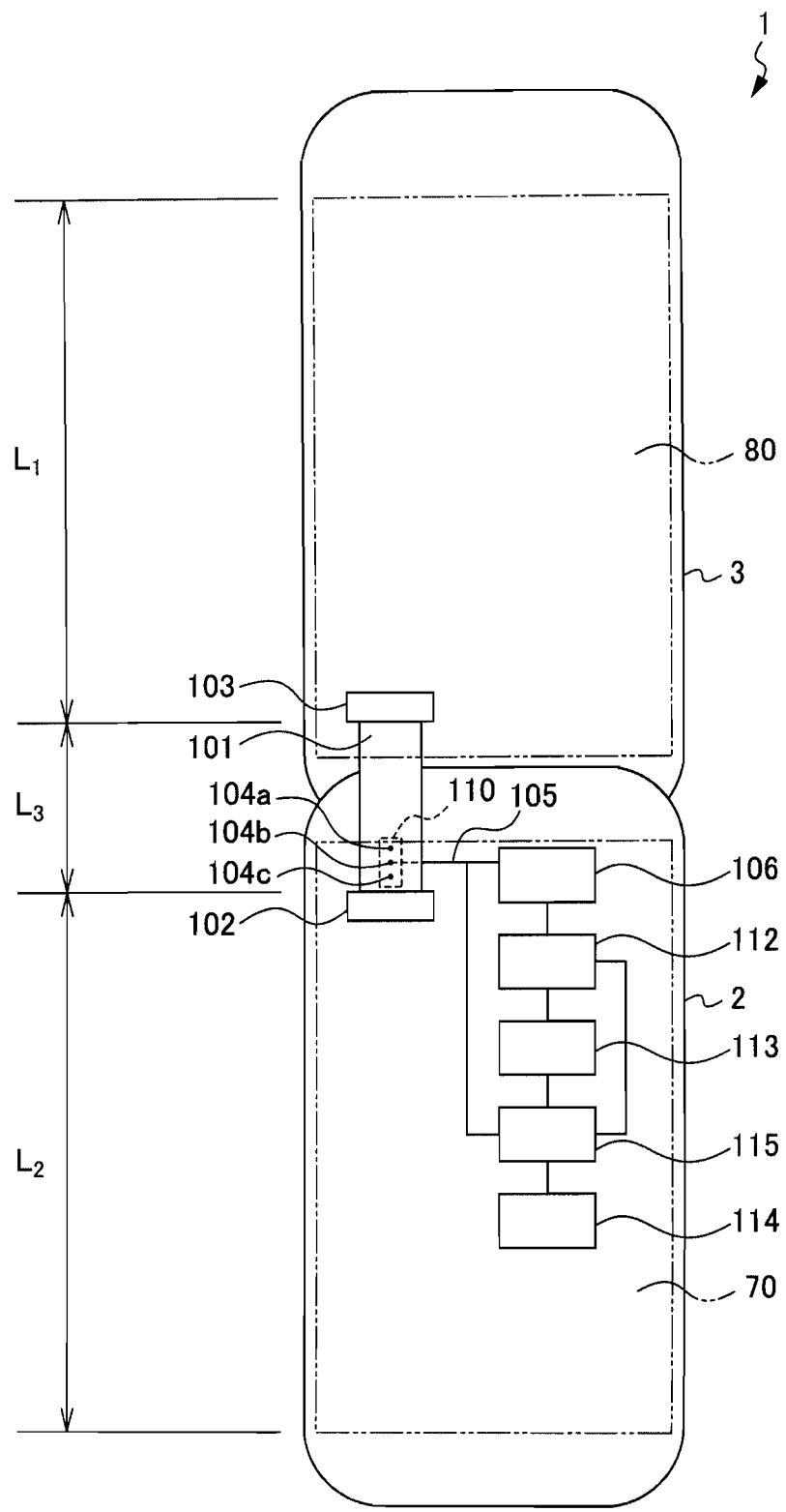
FIG. 9 is a view illustrating an internal structure of the cellular telephone device in an opened state according to a second embodiment.

FIG. 9 is a view illustrating an internal structure of the cellular telephone device 1 in an opened state of the second embodiment. As shown in FIG. 9, similarly to the first embodiment, the circuit board 70 and the circuit board 80 in the cellular telephone device 1 are electrically connected by way of the FPC 101.

The cellular telephone device 1 of the second embodiment is mainly different from that of the first embodiment in that the former includes a contact point 104a, a contact point 104b, a contact point 104c, an power feed portion 109a, an power feed portion 109b, an power feed portion 109c, a switch unit 110, a tuner unit 112 that receives broadcast waves, a decoder unit 113 that decodes the broadcast waves received by the tuner unit 112, an angle detector 114, and a control unit 115 that performs overall control of the cellular telephone device 1.

Figure 10:
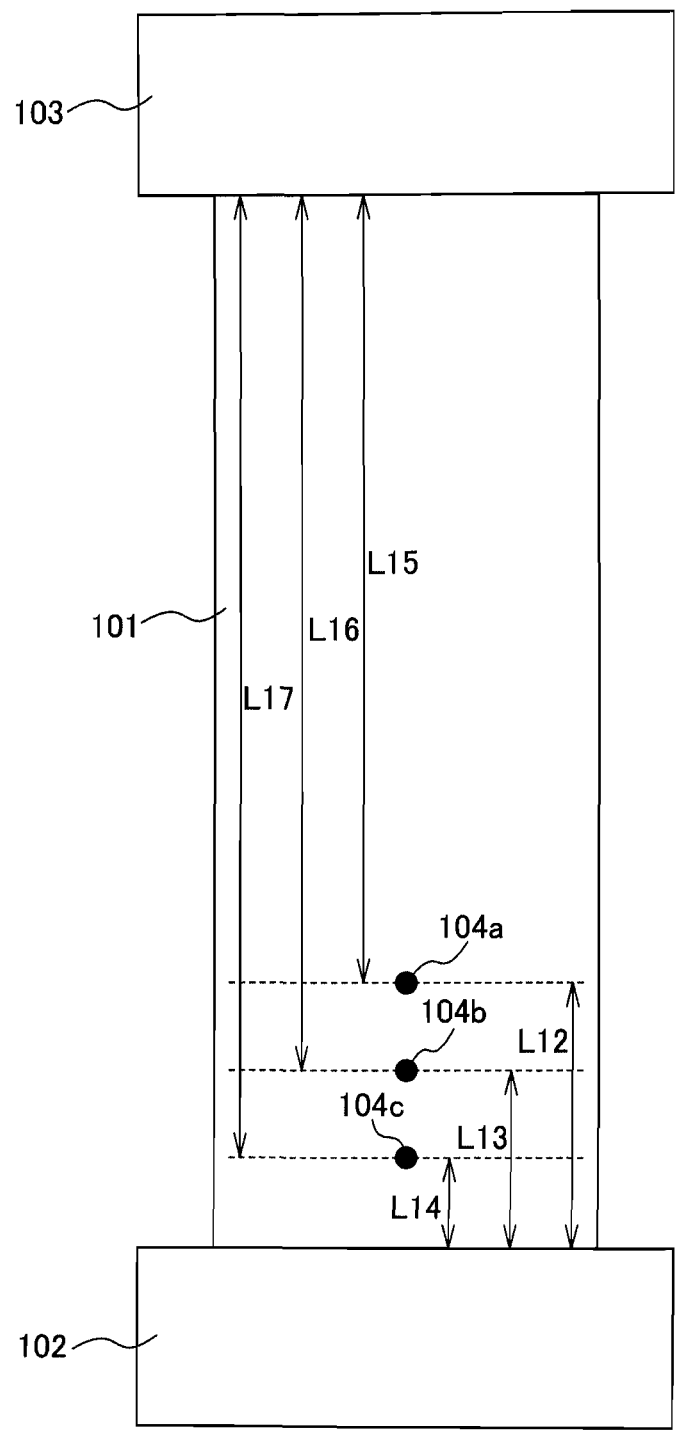
FIG. 10 is an enlarged view of the FPC unit.

FIG. 10 is an enlarged view of the FPC unit 101 in FIG. 9. As shown in FIG. 10, the contact point 104a and the contact point 104b are spaced apart from each other by a distance L10. The contact point 104b and the contact point 104c are spaced apart from each other by a distance L11.

The contact point 104a is a length L12 from an end portion of the FPC connector 102 and is arranged a length L15 from the other end portion of the FPC connector 102. Furthermore, the contact point 104b is a length L13 from one end portion of the FPC connector 102 and is arranged a length L16 from the other end portion of the FPC connector 102. Furthermore, the contact point 104c is a length L14 from one end portion of the FPC connector 102 and is arranged a length L17 from the other end portion of the FPC connector 102.

Figure 11:
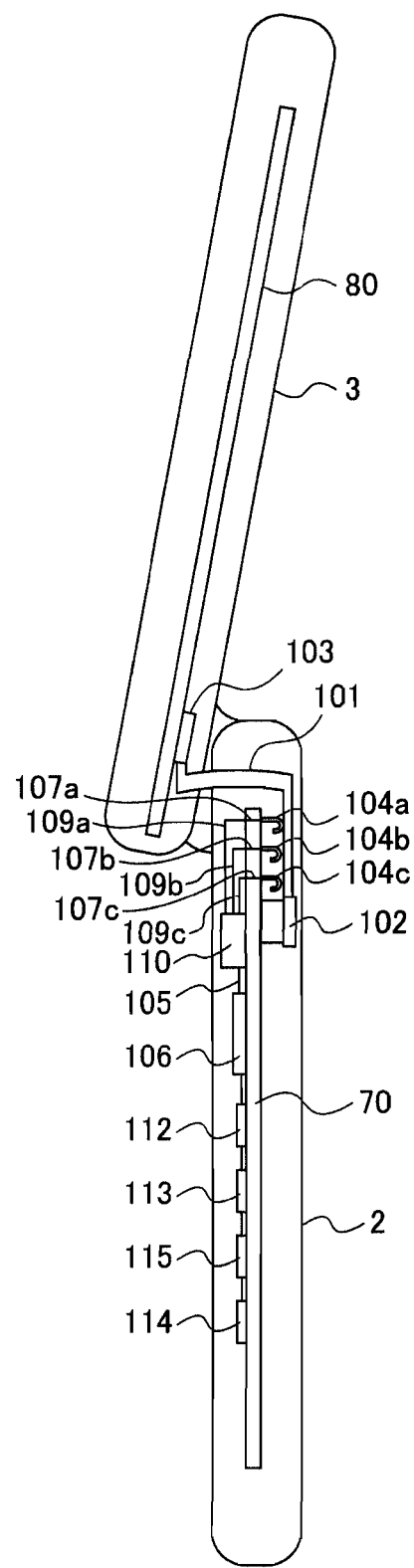
FIG. 11 is a view illustrating a conductive structure of the contact point and the power feed portion of the cellular telephone device in an opened state according to the second embodiment.
Figure 12:
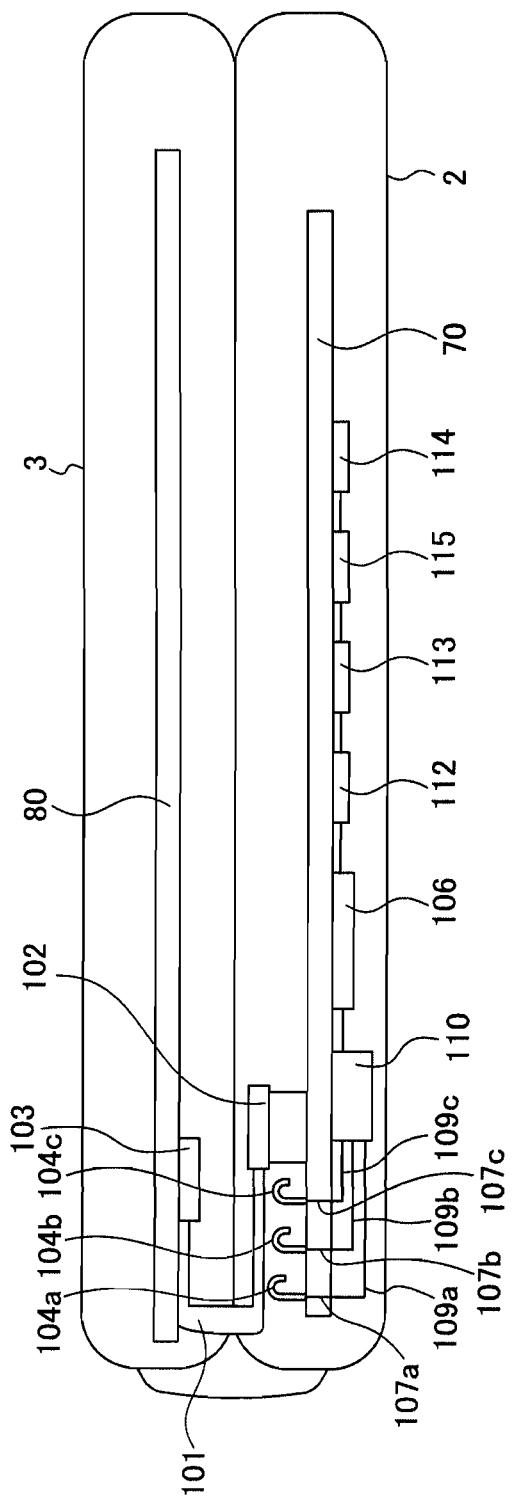
FIG. 12 is a view illustrating a conductive structure of the contact point and the power feed portion of the cellular telephone device in a closed state according the second embodiment.

FIG. 11 is a view illustrating a conductive structure of the contact points 104a, 104b, and 104c, and the power feed portions 109a, 109b, and 109c of the cellular telephone device 1 in an opened state according to the second embodiment, and FIG. 12 is a view illustrating a conductive structure of the contact points 104a, 104b, and 104c, and the power feed portions 109a, 109b, and 109c in an closed state of the cellular telephone device 1 of the second embodiment.

As shown in FIGS. 11 and 12, the RF circuit portion 106 is mounted on a surface opposite to a surface on which the FPC connector 102 is arranged. Furthermore, opening portions 107a, 107b, and 107c are formed on the circuit board 70. Then, the contact points 104a, 104b, and 104c are provided on the FPC unit 101 (the shield layer 240). The power feed portions 109a, 109b, and 109c are configured by a member having a spring characteristics and one end thereof are connected with the switch unit 110 electrically. Furthermore, the other one end of the power feed portions 109a, 109b, and 109c are adapted to allow themselves to be in contact with or spaced apart from the contact points 104a, 104b, and 104c via the opening portions 107a, 107b, and 107c, respectively, due to spring characteristics.

The switch unit 110 is adapted to allow itself to select among a first state in which the power feed portion 109a is connected to the contact point 104a electrically, a second state in which the power feed portion 109b is connected to the contact point 104b electrically, and a third state in which the power feed portion 109c is connected to the contact point 104c electrically. More specifically, the switch unit 110 is adapted to switch to one state (contact point) from among the first state, the second state, and the third state, in accordance with a control signal from the control unit 115.

The tuner unit 112 receives, for example, broadcast waves as a signal which is resonated by the reference electric potential pattern layer 86. The decoder unit 113 decodes broadcast waves received by the tuner unit 112. In the present embodiment, the tuner unit 112 and the decoder unit 113 function as a function executing unit that executes a function based on a signal resonated by the reference electric potential pattern layer 86 functioning as an antenna element.

The angle detector 114 detects an opening angle of the operation unit side housing 2 in relation to the display unit side housing 3, i.e. a signal in accordance with a relative movement state of the operation unit side housing 2 and the display unit side housing 3, and outputs the signal thus detected to the control unit 115.

The control unit 115 controls selection of the first state, the second state, and the third state by controlling switching of the switch unit 110.

More specifically, the control unit 115 controls the selection of the first state, the second state, and the third state by switching the switch unit 110 in accordance with the relative movement state of the operation unit side housing 2 and the display unit side housing 3 detected by the angle detector 114.

According to the cellular telephone device 1 of the present embodiment, the contact point 104a, the contact point 104b, and the contact point 104c are provided at the shield layer 240 in this way, and the switch unit 110 is provided which can select connections from between the power feed portion 109a and the contact point 104a, between the power feed portion 109b and the contact point 104b, and between the power feed portion 109c and the contact point 104c. Then, the control unit 115 controls the selection from among the first state, the second state, and the third state by switching the switch unit 110 in accordance with the relative movement state of the operation unit side housing 2 and the display unit side housing 3 detected by the angle detector 114.

Therefore, since the cellular telephone device 1 can adjust the range functioning as an antenna element in the shield layer 240 in accordance with the selection of the switch unit 110 performed based on the control of the control unit 115, it is possible to achieve adjustment and preservation of antenna characteristics in the shield layer 240 (shield layer 260).

Herein, since the relative positions of the reference electric potential pattern layer 86 and the shield layer 240, which function as an antenna element, and the reference electric potential pattern layer 75, which functions as a grounding portion, are different between the opened state and closed state of the cellular telephone device 1, the antenna characteristics of the reference electric potential pattern layer 86 and the shield layer 240 may decline. Furthermore, the impedance of the shield layer 240 differs between the contact point 104a, the contact point 104b, and the contact point 104c. According to the cellular telephone device 1 of the present embodiment, a decline in the antenna characteristics of the reference electric potential pattern layer 86 and the shield layer 240 can be suppressed by changing the position of the contact point in accordance with the relative movement state of the cellular telephone device 1 detected by the angle detector 114.

More specifically, when transitioning the cellular telephone device 1 from the opened state to the closed state, the distance between the circuit board 70 and the circuit board 80 becomes close to each other. Furthermore, the operation unit side housing 2 and the display unit side housing 3 are generally formed using resin having a predetermined dielectric constant.

Furthermore, in a case of transitioning the cellular telephone device 1 from the opened state to the closed state without switching the switch unit 110 from the contact point 104b, for example, since the circuit board 70 and the circuit board 80 become close to the operation unit side housing 2 and the display unit side housing 3 having a predetermined dielectric constant, the resonant frequency of the reference electric potential pattern layer 86 and the shield layer 240 that operate as an antenna in the closed state becomes lower than that in the opened state.

In this case, the control unit 115 controls the switch unit 110 to select the contact point 104a. In this way, since the sum total value of the length L1 of the reference electric potential pattern layer 86 and the length L15 of the shield layer 240 (L1+L15) becomes shorter than the sum total value of the length L1 of the reference electric potential pattern layer 86 and the length L16 of the shield layer 240 (L1+L16), it is possible to maintain the antenna characteristics by adjusting the resonant frequency of the reference electric potential pattern layer 86 and the shield layer 240 to a high value.

Similarly, in a case of transitioning the cellular telephone device 1 from the closed state to the opened state, since the circuit board 70 and the circuit board 80 are spaced away from the operation unit side housing 2 and the display unit side housing 3 having a predetermined dielectric constant, the resonant frequency of the reference electric potential pattern layer 86 and the shield payer 240 that operate as an antenna in the opened state becomes lower than that in the closed state.

In this case, the control unit 115 controls the switch unit 110 to select the contact point 104c. In this way, since the sum total value of the length L1 of the reference electric potential pattern layer 86 and the length L17 of the shield layer 240 (L1+L17) becomes longer than the sum total value of the length L1 of the reference electric potential pattern layer 86 and the length L16 of the shield layer 240 (L1+L16), it is possible to maintain the antenna characteristics by adjusting the resonant frequency of the reference electric potential pattern layer 86 and the shield layer 240 to a low value.

Furthermore, when transitioning the cellular telephone device 1 to an intermediate state between the opened state and the closed state, the resonant frequency of the reference electric potential pattern layer 86 and the shield layer 240 that function as an antenna element becomes lower than the resonant frequency in the opened state and higher than the resonant frequency in the closed state.

Then, the control unit 115 controls the switch unit 110 to select the contact point 104b. In this way, the sum total value of the length L1 of the reference electric potential pattern layer 86 and the length L16 of the FPC unit 101 (L1+L16) becomes longer than the sum total value of the length L1 of the reference electric potential pattern layer 86 and the length L15 of the shield layer 240 (L1+L15), and shorter than the sum total value (L1+L17) of the length L1 of the reference electric potential pattern layer 86 and the length L17 of the shield layer 240. Therefore, it is possible to maintain the antenna characteristics by adjusting the resonant frequency of the reference electric potential pattern layer 86 and the shield layer 240 to a higher value than in the opened state and to a lower value than in the closed state.

Furthermore, the control unit 115 may be adapted to control the selection among the first state, the second state, and the third state by the switch unit 110 in accordance with the frequency of the broadcast wave, which is a signal resonated by the tuner unit 112 and the decoder unit 113.

With such a configuration, it is possible to maintain the antenna characteristics according to the signal which is resonated by the reference electric potential pattern layer 86 and is a basis for operation of the tuner unit 112 and the decoder unit 113.

More specifically, the reference electric potential pattern layer 75, the FPC unit 101, and the reference electric potential pattern layer 86 that function as a dipole antenna can be adapted as an antenna for terrestrial digital broadcasting, for example. In the following, an example will be explained for case in which switching of the contact points 104a, 104b, and 104c by the switch unit 110 is adapted for terrestrial digital broadcasting.

Terrestrial digital broadcasting uses the UHF band, and the received frequency band thereof is quite wide ranging from 473 MHz to 737 MHz. Therefore, wide band characteristics are required for an antenna for terrestrial digital broadcasting as well.

Consequently, the received frequency from 473 MHz to 737 MHz is divided into three frequency bands, for example. Then, a lower band of the frequency is defined as UHF_L, an intermediate band of the frequency is defined as UHF_M, and a higher band of the frequency is defined as UHF_H.

Then, for example, in a case in which a channel of UHF_L, which is the low band of frequency, is selected in accordance with the manipulation of the operation key group 11, the control unit 115 controls the switch unit 110 to select the contact point 104c. As shown in FIG. 10, since the sum total value of the length L1 of the reference electric potential pattern layer 86 and the length L17 of the shield layer 240 (L1+L17) becomes longer than the sum total value of the length L1 of the reference electric potential pattern layer 86 and the length L16 of the shield layer 240 (L1+L16) in this way, it is possible to obtain preferable antenna characteristics in UHF_L by adjusting the resonant frequency of the reference electric potential pattern layer 86 and the shield layer 240 to a low value.

Similarly, in a case in which a channel of UHF_H, which is the high band of frequency, is selected, the control unit 115 controls the switch unit 110 to select the contact point 104a. Since the sum total value of the length L1 of the reference electric potential pattern layer 86 and the length L15 of the shield layer 240 (L1+L15) becomes shorter than the sum total value of the length L1 of the reference electric potential pattern layer 86 and the length L16 of the shield layer 240 (L1+L16) in this way, it is possible to obtain preferable antenna characteristics in UHF_H by adjusting the resonant frequency of the reference electric potential pattern layer 86 and the shield layer 240 to a high value.

Similarly, in a case in which a channel of UHF_M, which is the intermediate band of frequency, is selected, the control unit 115 controls the switch unit 110 to select the contact point 104b. In this way, the sum total value of the length L1 of the reference electric potential pattern layer 86 and the length L16 of the shield layer 240 (L1+L16) becomes longer than the sum total value of the length L1 of the reference electric potential pattern layer 86 and the length L15 of the shield layer 240 (L1+L15), and shorter than the sum total value (L1+L17) of the length L1 of the reference electric potential pattern layer 86 and the length L17 of the shield layer 240. Therefore, it is possible to obtain preferable antenna characteristics at UHF_M by adjusting the resonant frequency of the reference electric potential pattern layer 86 and the shield layer 240.

By configuring in this way, it is possible to obtain preferable antenna characteristics for terrestrial digital broadcasting by switching the switch unit in accordance with a frequency band thus received.

Third Embodiment

Figure 13:
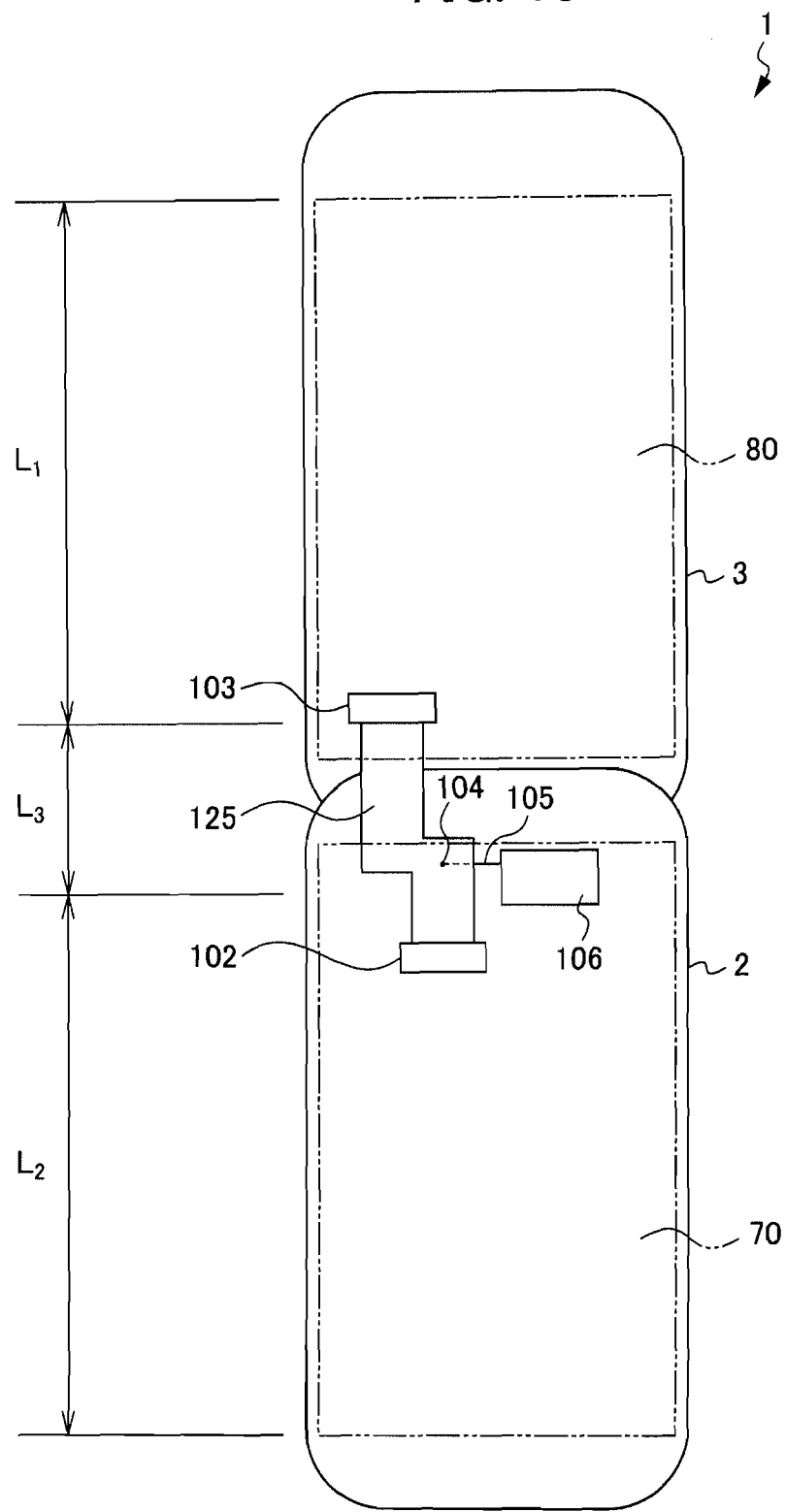
FIG. 13 is a view illustrating an internal structure of the cellular telephone device in an opened state according to a third embodiment.

FIG. 13 is a view illustrating an internal structure of the cellular telephone device 1 in an opened state according to a third embodiment according to the present invention. As shown in FIG. 13, in the cellular telephone device 1 of the third embodiment, an FPC unit 125 is formed not in a linear shape, but rather is bent in an L-shape at the circuit board 70 side and bent in an L-shape again to connect with the FPC connector 102. Since the length of the FPC unit 125, that is, the length of the shield layer 240, can thereby be changed, it is possible to adjust the resonant frequency of the reference electric potential pattern layer 86 and the shield layer 240 that functions as an antenna element.

Fourth Embodiment

Figure 14:
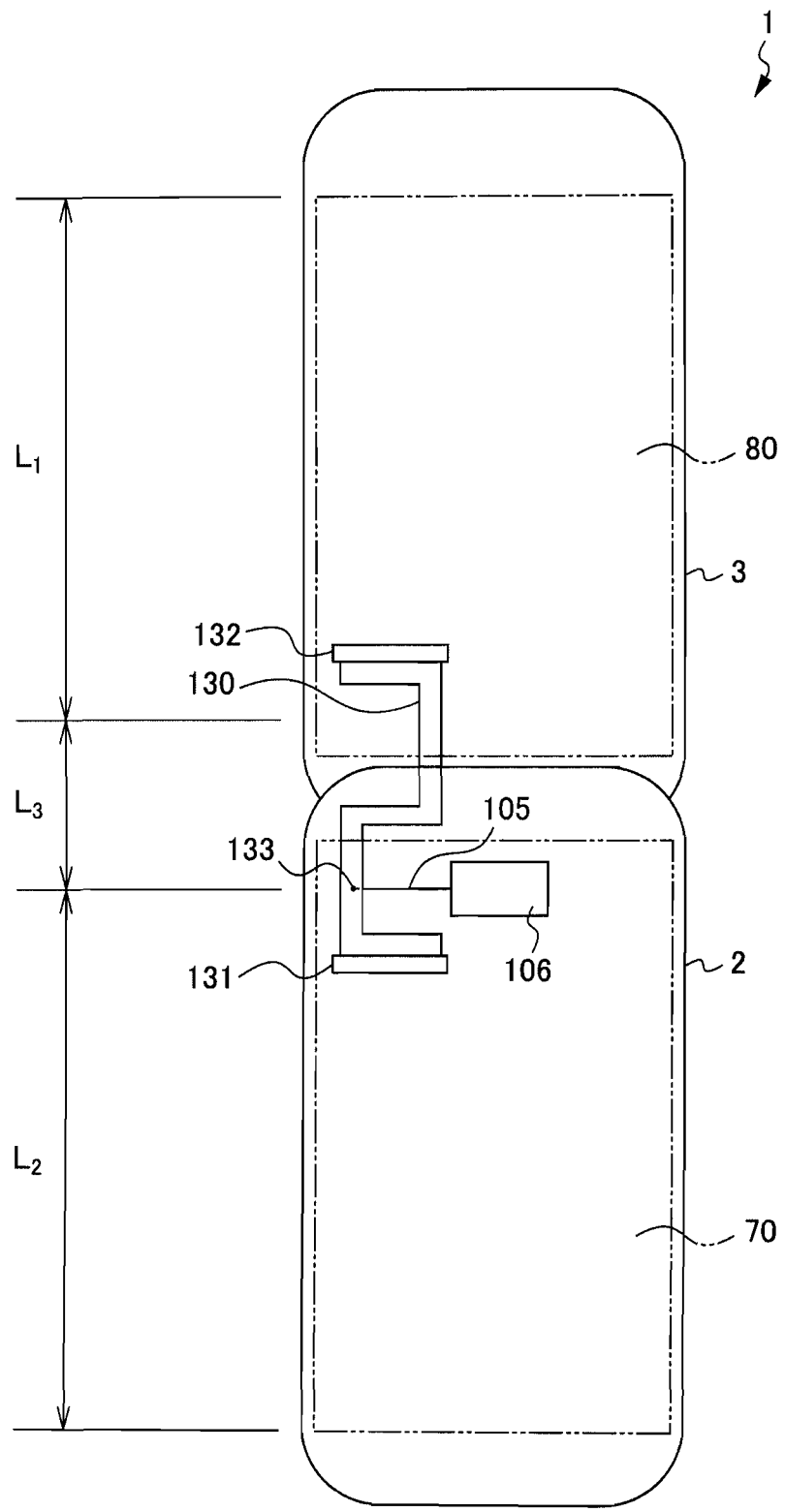
FIG. 14 is a view illustrating an internal structure of the cellular telephone device in an opened state according a fourth embodiment.

FIG. 14 is a view illustrating an internal structure of the cellular telephone device 1 in an opened state according to a fourth embodiment of the present invention. As shown in FIG. 14, the cellular telephone device 1 according to the fourth embodiment is formed with a thin coaxial cable 130 in place of the FPC unit 101. Then, the thin coaxial cable 130 is electrically connected with the circuit board 80 via a connector 131. Furthermore, the thin coaxial cable 130 is electrically connected with the circuit board 70 via a connector 132. Moreover, power is fed to the thin coaxial cable 130 from the power feed portion of the RF circuit portion 106 via the contact point 133 or the thin line coaxial cable 130 feeds power to the power feed portion of the RF circuit portion 106 via the contact point 133. In this way, similar effects to the abovementioned embodiments can be exerted even when using the thin coaxial cable 130 instead of the FPC unit 101.

As described above, although an embodiment of the present invention has been explained, the present invention is not limited to the abovementioned embodiment, and can be appropriately modified. For example, in the abovementioned embodiment, the ground pattern is provided on the circuit board 70 and the reference electric potential pattern layer 75 as the first conductive portion is electrically connected with the grounding portion of the RF circuit portion 106; however, the present invention is not limited thereto, and if the electric potential between the reference electric potential pattern layer 75 and the RF circuit portion 106 is the same potential, the reference electric potential pattern layer 75, the FPC unit 101 (the shield layer 240), and the reference electric potential pattern layer 86 can function as a dipole antenna.

Furthermore, in the abovementioned embodiment, although the first conductive portion is the reference electric potential pattern layer 75 formed on the circuit board 70, the present invention is not limited thereto. For example, the first conductive portion may form a shield case formed on the circuit board 70 or a portion of an outer surface of the operation unit side housing 2 and may be composed of a detachable conductive case material.

Furthermore, in the abovementioned embodiment, although the second conductive portion is the reference electric potential pattern layer 86 formed on the circuit board 80, the present invention is not limited thereto. For example, the second conductive portion may form a shield case formed on the circuit board 80 or a portion of an outer surface of the display unit side housing 3 and may be composed of a detachable conductive case material.

Furthermore, in the abovementioned embodiment, three contact points are provided to the FPC unit 101 and these contact points are switched by the switch unit 110; however, the present invention is not limited thereto, and any number of contact points in accordance with the desired frequencies may be provided and the contact points thus provided may be switched by the switch unit 110.

Fifth Embodiment

Next, the cellular telephone device 1 according to a fifth embodiment of the present invention will be explained with reference to FIGS. 7 and 15. In the following, the points in which a cellular telephone device 1 according to the fifth embodiment differs from the cellular telephone device 1 according to the first embodiment will be mainly explained, and similar configurations and operations therebetween are abbreviated or omitted. The cellular telephone device 1 according to the fifth embodiment is mainly different from that of the first embodiment in that a shield layer 240a, which is a top surface side of the shield layer 240 of the FPC unit 101, and a shield layer 240b, which is a back surface side of the shield layer 240 of the FPC unit 101, are allowed to operate as a separate antenna element, respectively.

As shown in FIG. 7 described above, the shield layer 240 in the FPC unit 101 is composed of the shield layer 240 of the top surface side (the first shield layer) and the shield layer 240 of the back surface side (the second shield layer). It should be noted that, in the following embodiment, the shield layer 240 of the top surface side is referred to as a shield layer 240a and the shield layer 240 of the back surface side is referred to as a shield layer 240b for ease of explanation.

The FPC unit 101 is configured by sandwiching the signal wires 210 with the shield layer 240a and the shield layer 240b. More specifically, the FPC unit 101 is configured by sandwiching the signal wires 210 by the shield layer 240a and the shield layer 240b via the insulation layer 220 and the conductive adhesive layer 230.

Figure 15:
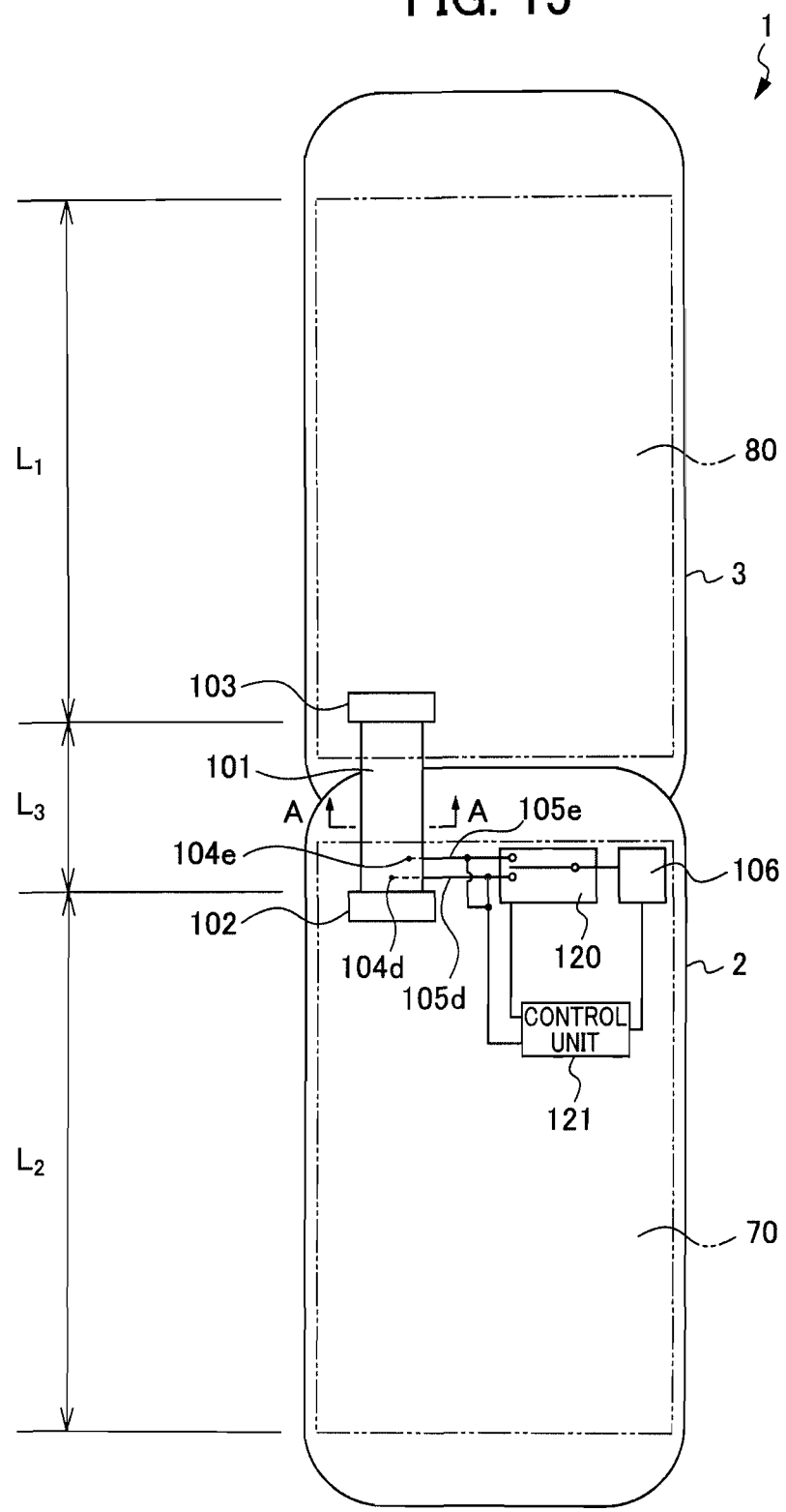
FIG. 15 is a view illustrating an internal structure of the cellular telephone device in an opened state according to a fifth embodiment.

FIG. 15 is a view illustrating an internal structure of the cellular telephone device 1 in an opened state according to the fifth embodiment. As shown in FIG. 15, the circuit board 70 includes the FPC connector 102, a signal line 105d, a signal line 105e, an RF circuit portion 106 (signal processing unit), a switching unit 120 (second selector unit), and a control unit 121 (second control unit). It should be noted that an explanation for the FPC connector 102 is omitted since it has a similar configuration to the first embodiment.

Contact points 104d and 104e of an power feed portion are formed at the FPC unit 101. The contact point 104d is formed on the shield layer 240a and is connected with the signal line 105d electrically. The contact point 104e is formed on the shield layer 204b and is connected with the signal line 105e electrically. That is, the contact point 104d and the contact point 104e are connected with a switching unit 120 via the signal line 105d and the signal line 105e, respectively.

The shield layer 240a and the shield layer 240b are electrically connected with the contact portion 104d at the operation unit side housing 2, and are connected with the reference electric potential pattern layer 86 electrically at the display unit side housing 3.

The switching unit 120, for example, is configured with a switch and the like, and switches electrically between the shield layer 240a and the shield layer 240b in accordance with the control of the control unit 121.

More specifically, the switching unit 120 is configured so as to be able to select either one of a first state in which the shield layer 240a is electrically connected with the contact point 104d at the operation unit side housing 2 and is electrically connected with the reference electric potential pattern layer 86 at the display unit side housing 3, or a second state in which the shield layer 240b is electrically connected with the contact point 104d at the operation unit side housing 2 and is electrically connected with the reference electric potential pattern layer 86 at the display unit side housing 3.

Then, by being switched by the switching unit 120, either one of the shield layer 240a and the shield layer 240b functions as a portion of an antenna element.

The control unit 121 is electrically connected with and controls the signal line 105, the RF circuit portion 106, and the switching unit 120.

The RF circuit portion 106 performs processing on a signal received by using either one of the shield layer 240a and the shield layer 240b as a portion of an antenna element by switching by way of the switching unit 120.

Next, an operational example will be explained for when the shield layer 240 according to the fifth embodiment functions as an antenna.

For example, during a call in the opened state of the cellular telephone device 1, the control unit 121 switches the switching unit 120 and selects the contact point 104e. In this case, the reference electric potential pattern layer 75 functions as a ground side of the antenna element. In addition, the shield layer 240b functions as a portion of a radiating element of the antenna element. Furthermore, the reference electric potential pattern layer 86 functions as a radiating element of the antenna element. In this way, the reference electric potential pattern layer 75, the shield layer 240b, and the reference electric potential pattern layer 86 function as an antenna element (for example, a monopole antenna, a dipole antenna, and the like).

On the other hand, for example, during data communication or manipulations of the operation key group 11, the control unit 121 switches the switching unit 120 and selects the contact point 104d. In this case, the reference electric potential pattern layer 75 functions as a radiating element on a ground side of the antenna element. In addition, the shield layer 240a functions as a portion of the radiating element of the antenna element. Furthermore, the reference electric potential pattern layer 86 functions as a radiating element of the antenna element. In this way, the reference electric potential pattern layer 75, the shield layer 240a, and the reference electric potential pattern layer 86 function as an antenna element (for example, a monopole antenna, a dipole antenna, and the like).

The radiative efficiency while functioning as a radiating element of the antenna element may decline more in the closed state than in the opened state of the cellular telephone device 1. However, according to the cellular telephone device 1 of the fifth embodiment, the signal wires 210 are configured to be sandwiched by the shield layer 240a of the top side and the shield layer 240b of the back side. In addition, the shield layer 240a is electrically connected with the contact point 104d at the operation unit side housing 2, and the shield layer 240b is electrically connected with the contact point 104e at the operation unit side housing 2. In addition, the shield layer 240a and the shield layer 240b are electrically connected with the reference electric potential pattern layer 86 at the display unit side housing 3. Therefore, it is possible to supply electric power at both surfaces of the shield layer 240a and the shield layer 240b and to suppress a decline in radiative efficiency even in the closed state.

In addition, according to the cellular telephone device 1 of the fifth embodiment, for example, during a call, the face of a user comes close to a side of the front case 2a and the front panel 3a of the cellular telephone device 1. In this case, by the switching unit 120 being switched, the shield layer 240b functions as a portion of the antenna element and the shield layer 240a shields noise and the like from the signal wires 210.

On the other hand, for example, during data communication or manipulation of the operation key group 11, the face of a user moves away from the side of the front case 2a and the front panel 3a of the cellular telephone device 1. In this case, by the switching unit 120 being switched, the shield layer 240a functions as a portion of an antenna element and the shield layer 240b shields noise and the like from the signal wires 210.

Accordingly, in a case in which the face of a user comes close to the side of the front case 2a and the front panel 3a of the cellular telephone device 1 during a call, for example, it is possible to suppress the radiation of radiowaves, noise, and the like to the user's housing and achieve a reduction in SAR (Specific Absorption Rate).

In addition, the RF circuit portion 106 may be configured to perform predetermined signal processing based on the signal received at the shield layer 240a and the signal received at the shield layer 240b. More specifically, the control unit 121 compares the intensity of a signal received at the shield layer 240a with the intensity of a signal received at the shield layer 240b, and controls so as to switch the switching unit 120 to select the side having higher (greater) signal intensity. In addition, the RF circuit portion 106 may be configured to perform processing on a signal received at either one of the shield layer 240a or the shield layer 240b switched by the switching unit 120.

It should be noted that, although the FPC unit 101 shown in FIG. 7 has been described as a configuration example of the FPC unit 101 in the fifth embodiment, the FPC unit 101 may be configured as shown in FIG. 8.

Sixth Embodiment

Next, the cellular telephone device 1 according to the sixth embodiment of the present invention will be explained with reference to FIGS. 16 to 18. In the following, the points in which the cellular telephone device 1 according to the sixth embodiment differs from the cellular telephone device 1 according to the first embodiment will be mainly explained, and explanations for similar configurations and operations between the sixth embodiment, and the first embodiment and the fifth embodiment are abbreviated or omitted. The cellular telephone device 1 of the sixth embodiment mainly differs in that it is configured so as to be able to support a plurality of different frequencies at the shield layers 240a and 240b of the FPC unit 101.

FIG. 16 is a view illustrating a configuration example of the FPC unit 101 according to the sixth embodiment. FIG. 16A is a view illustrating a configuration of a top surface of the FPC unit 101 and FIG. 16B is a view illustrating a configuration of a back surface of the FPC unit 101.

As shown in FIG. 16A, a plurality of slits (grooves) 241a is formed in the shield layer 240a at the surface side of the FPC unit 101. The shield layer 240a is configured in a meandering shape (first shape) that resonates with a first frequency (portions denoted by diagonal lines of FIG. 16A) by the slit 24 being formed. In addition, a contact point 104d as an power feed portion is formed on the shield layer 240a.

On the other hand, as shown in FIG. 16B, a slit is not formed in the shield layer 240b at the back side of the FPC unit 101, and the shield layer 240b is configured in substantially a rectangular shape (second shape) that resonates with a second frequency different from the first frequency (portions denoted by diagonal lines of FIG. 16B). In addition, a contact point 104e as an power feed portion is formed on the shield layer 240b.

The contact point 104d and the contact point 104e are electrically connected with the signal line 105d and the signal line 105e, respectively. The signal lines 105d and 105e are electrically connected with the switching unit 120.

Then, similarly to the fifth embodiment, the switching unit 120 is configured so as to be able to select either one of a first state in which the shield layer 240a is electrically connected with the contact point 104d at the operation unit side housing 2 and is electrically connected with the reference electric potential pattern layer 86 at the display unit side housing 3 or a second state in which the shield layer 240b is electrically connected with the contact point 104e at the operation unit side housing 2 and is electrically connected with the reference electric potential pattern layer 86 at the display unit side housing 3.

In this way, the shield layer 240a is formed in a meandering shape and the shield layer 240b is formed in a substantially rectangular shape. Therefore, the shield layer 240a is longer than the shield layer 240b in terms of high frequency passing through. Therefore, the shield layer 240a resonates with the first frequency, the shield layer 240b resonates with the second frequency, and it can allow the shield layer 240a and the shield layer 240b to function as a portion of a multiband antenna that can support a plurality of different frequencies.

Figure 17A:
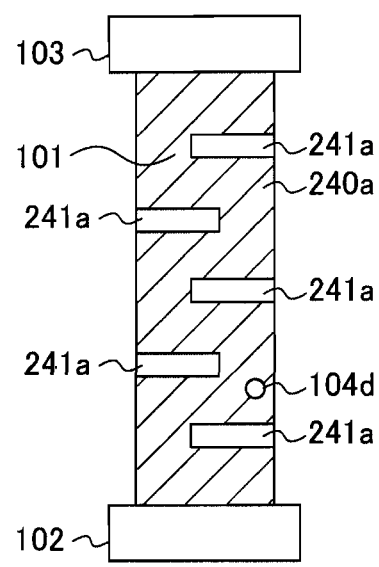
FIG. 17 is a view illustrating another configuration example of the FPC unit 101 according to the sixth embodiment.
Figure 17B:
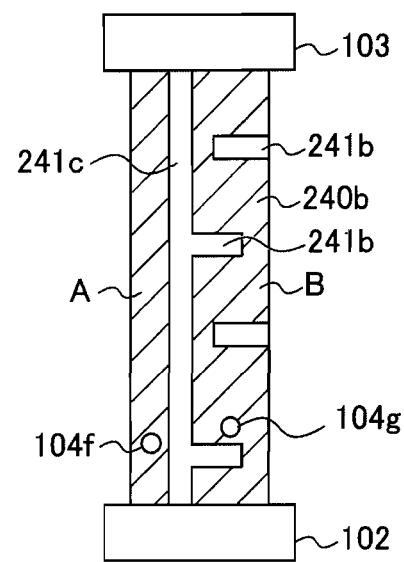

FIG. 17 is a view illustrating another configuration example of the FPC unit 101 according to the sixth embodiment. FIG. 17A is a view illustrating a configuration of a top surface of the FPC unit 101 and FIG. 17B is a view illustrating a configuration of a back surface of the FPC unit 101.

The configuration of the top surface side of the FPC 101 unit shown in FIG. 17A is the same as that of the top surface side of the FPC unit 101 as shown in FIG. 16A above, and the shield layer 240a is configured in a meandering shape (first shape) that resonates with the first frequency (portions denoted by diagonal lines of FIG. 17A). In addition, the contact point 104d is formed on the shield layer 240a.

On the other hand, as shown in FIG. 17B, a slit 241b and a slit 241c are formed in the shield layer 240b at the back surface side of the FPC unit 101 (portions denoted by diagonal lines of FIG. 17B). More specifically, the slit 241b is formed along the longitudinal direction of the FPC unit 101 with a constant width.

The slit 241c divides the shield layer 240b to right and left, and thus, a shield region A and a shield region B are formed on the shield layer 240b. A plurality of slit 241b is formed on the shield region B that is divided by the slit 241c to right and left.

The shield region A is in a linear shape (substantially rectangular shape) due to the slit 241c. On the other hand, the shape of the shield region B is in a meandering shape due to the slits 241b and the slit 241c of which length in terms of electricity passing through is different from that of the shield region C. In this way, the shield layer 240b is configured in a linear shape that resonates with the second frequency and a shape (second shape) with a meandering shape that resonates with the third frequency.

Furthermore, the contact point 104f as the power feed portion is formed on the shield region A and the contact point 104g as the power feed portion is formed on the shield region B.

In this way, the shield layer 240a is configured in a meandering shape (first shape) that resonates with the first frequency band. Furthermore, the shield layer 240b includes the shield region A, which is configured in a linear shape that resonates with the second frequency band, and the shield region B, which is configured in a meandering shape that resonates with the third frequency band. Therefore, the lengths in terms of high frequency passing through are different between the shield region A and the shield region B of the shield layer 240a. Therefore, the cellular telephone device 1 can have the shield layer 240a and the shield layer 240b function as a portion of a multiband antenna that can support three different frequency bands.

Figure 18A:
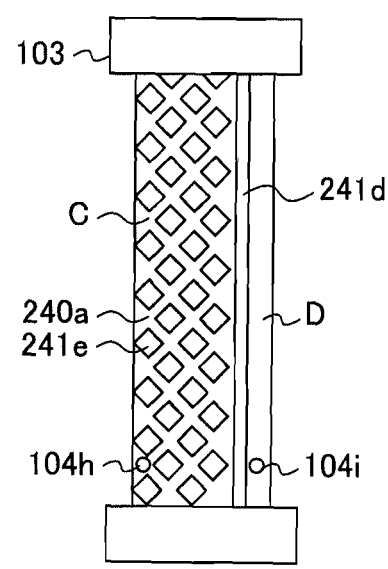
FIG. 18 is a view illustrating another configuration example of the FPC unit 101 according to the sixth embodiment.
Figure 18B:
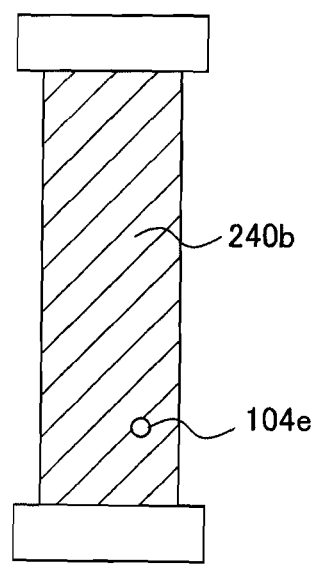

FIG. 18 is a view illustrating another configuration example of the FPC unit 101 according to the sixth embodiment. FIG. 18A is a view illustrating a configuration of a top surface side of the FPC unit 101, and FIG. 18B is a view illustrating a configuration of a back surface side of the FPC unit 101.

As shown in FIG. 18A, the shield layer 240a is formed on the top surface side of the FPC 101. A slit 241d and a slit 241e are formed in the shield layer 240a.

More specifically, the slit 241d is formed along the longitudinal direction of the FPC unit 101 with a constant width. Furthermore, a plurality of the slits 241e is formed at a predetermined interval in a shield region C, and each of slits 241e is substantially a rectangular shape.

The slit 241d divides the shield layer 240a into right and left sides and the shield region C and a shield region D are formed in the shield layer 240a.

The shield region C is formed in a lattice shape by the slit 241d and the slits 241e. Furthermore, the shield region D is formed in a linear shape by the slit 241d. In this way, the shield layer 240a includes the shield region C, which is configured in a lattice shape that resonates with the first frequency, and the shield region D, which is configured in a linear shape that resonates with the second frequency different from the first frequency.

On the other hand, FIG. 18B is a similar configuration to FIG. 16B described above and the shield layer 240b is formed on the back surface side of the FPC unit 101. In addition, the contact portion 104e is formed on the shield layer 240b.

A slit is not formed in the shield layer 240b and the shield layer 240b has a linear shape. The shield layer 240b is configured in a linear shape that resonates with a third frequency band different from the first and second frequency bands.

Furthermore, the contact point 104h of an power feed portion is formed on the shield region C, and the contact point 104i of an power feed portion is formed on the shield region D.

In this way, the shield layer 240a includes the shield region C, which is configured in a lattice shape that resonates with the first frequency band, and the shield region D, which is configured in a linear shape that resonates with the second frequency band. Furthermore, the shield layer 240b is configured in a linear shape that resonates with the third frequency band. Therefore, the lengths in terms of high frequency passing through are different between the shield region C and the shield region D of the shield layer 240b. Consequently, the shield region C, the shield region D, and the shield layer 240b can function as a portion of a multiband antenna that can support three different frequency bands.

It should be noted that, in the configuration examples of FIGS. 17 and 18 as described above, it may be configured that each contact point is electrically connected with the switching unit 120 via the signal line so that each contact point can be selected by switching of the switching unit 120, similarly to the configuration example of FIG. 16.

Seventh Embodiment

Figure 19:
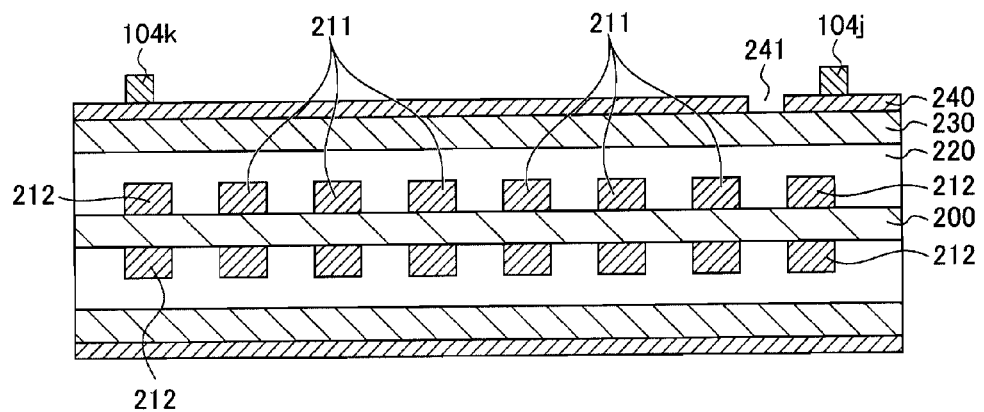
FIG. 19 is a cross-sectional view illustrating an internal structure of the FPC 101 according to a seventh embodiment.

Next, the cellular telephone device 1 of a seventh embodiment according to the present invention will be explained with reference to FIG. 19. FIG. 19 is a cross-sectional view illustrating an internal structure of the FPC 101 according to the cellular telephone device 1 of the seventh embodiment.

As shown in FIG. 19, the FPC 101 includes the base material 200, the signal wires 210, the insulation layer 220, the conductive adhesive layer 230, the shield layer 240, the slit 241, a contact point 104j, and a contact point 104k. The FPC unit 101 according to the seventh embodiment is mainly different from the FPC 101 (refer to FIG. 7) according to the first embodiment in that the former includes the slit 241, the contact point 104j, and the contact point 104k, and in that the configuration of the signal wires 210 of the former is different from that of the latter.

The signal wires 210 include a signal transmission line 211 and a ground line 212. A plurality of signal transmission lines 211 is provided inside the signal wires 210 in a width direction of the FPC unit 101 and transmits a signal. The ground line 212 is electrically connected with the reference electric potential (for example, the reference electric potential pattern layer 75, the reference electric potential pattern layer 86), and is provided outside of the signal wires 210 in a width direction of the FPC unit 101.

Herein, the purpose of providing the signal transmission line 211 inside in a width direction of the FPC unit 101 and providing the ground line 212 outside in a width direction of the FPC unit 101 is to protect the signal transmission line 211 from noise from outside, avoid radiating the noise radiated from the signal transmission line 211 to the outside of the FPC unit 101, and the like.

The contact points 104j and 104k are formed at locations facing the signal transmission line 211 on the shield layer 240 in a width direction of the FPC unit 101.

The shield layer 240 is electrically connected with the contact point 104j and the contact point 104k proximal to the ground line 212 at the operation unit side housing 2.

Furthermore, a slit (a groove) 241 with a predetermined depth is formed at the shield layer 240 to correspond to a location between the signal transmission line 211 and the ground line 212. Similarly to the slit 241d of FIG. 18A described above, the slit 241 is formed in the longitudinal direction of the FPC unit 101 with a constant width.

According to the cellular telephone device 1 of the seventh embodiment, the shield layer 240 is electrically connected with the contact point 104j and the contact point 104k proximal to the ground line 212 at the operation unit side housing 2. Therefore, by providing the contact point 104j and the contact point 104k as power feed portions proximal to the ground line 212, the distance between the contact point 104j and the contact point 104k, and the ground line 212, is longer than the distance between the contact point 104j and the contact point 104k, and the ground line 212. Therefore, the contact point 104j and the contact point 104k are less subjected to high frequency noise from the signal transmission line 211.

Furthermore, according to the cellular telephone device 1 of the seventh embodiment, the slit 241 with a predetermined depth is formed at the shield layer 240 to correspond a location between the signal transmission line 211 and the ground line 212. Therefore, the two contact points 104j and 104k can be provided as power feed portions in the cellular telephone device 1, and it is possible to feed power in a state in which the contact point 104j and the contact point 104k are less subjected to high frequency noise from the signal transmission line 211.

Eighth Embodiment

Figure 20:
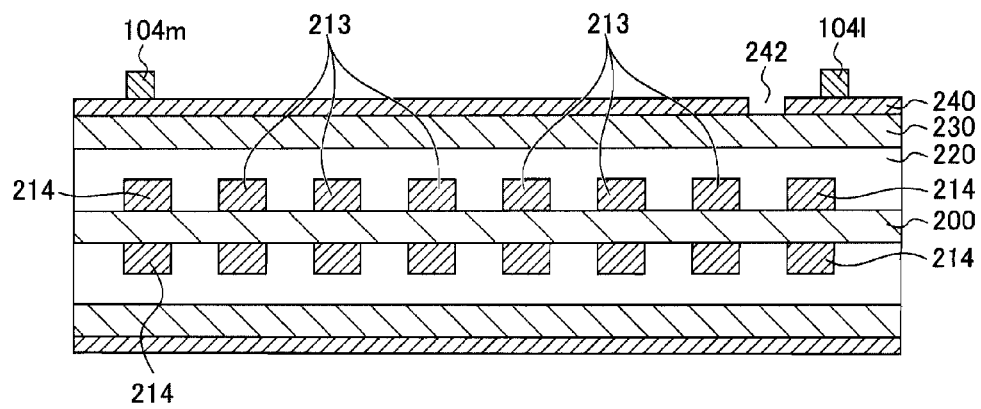
FIG. 20 is a cross-sectional view illustrating an internal structure of the FPC 101 according to the cellular telephone device 1 of the eighth embodiment.

Next, the cellular telephone device 1 according to an eighth embodiment of the present invention is described with reference to FIG. 20. FIG. 20 is a cross-sectional view illustrating an internal structure of the FPC 101 of the cellular telephone device 1 according to the eighth embodiment. It should be noted that, in the eighth embodiment, the points different from the seventh embodiment will be mainly explained, and explanation of similar configurations and operations therebetween are omitted.

As shown in FIG. 20, the FPC 101 includes the base material 200, the signal wires 210, the insulation layer 220, the conductive adhesive layer 230, the shield layer 240, the slit 241, the contact point 104l, and the contact point 104m. The FPC 101 according to the eighth embodiment is different from the FPC 101 (refer to FIG. 19) mainly in the configuration of the signal wires 210.

The signal wires 210 include a first signal transmission line 213 and a second signal transmission line 214.

The first signal transmission line 213 is provided in the signal wires 210 and transmits a signal at a first transmission rate. The second signal transmission line 214 is provided in the signal wires 210 and transmits a signal at a second transmission rate, which is faster than the first transmission rate. The contact points 104l and 104m are formed at locations facing the signal transmission line 211 on the shield layer 240 in a width direction of the FPC unit 101.

The shield layer 240 is electrically connected with the contact point 104l and the contact point 105m more proximal to the first signal transmission line 213 than the second signal transmission line 214 at the operation unit side housing 2.

A slit (a groove) 242 with a predetermined depth is formed in the shield layer 240 to correspond to locations between the first signal transmission line 213 and the second transmission line 214. Similarly to the slit 241 of the seventh embodiment as described above, the slit 242 is formed in the longitudinal direction of the FPC unit 101 with a constant width.

According to the eighth embodiment, the shield layer 240 is electrically connected with the contact point 104l and the contact point 105m proximal to the first signal transmission line 213 at the operation unit side housing 2. Therefore, by providing the contact point 104l and the contact point 105m as power feed portions proximal to the first signal transmission line 213, the distance between the contact point 104l and the contact point 105m, and the second signal transmission line 214 is longer than the distance between the contact point 104l and the contact point 105m, and the first signal transmission line 213. Therefore, the contact point 104l and the contact point 105m are less subjected to high frequency noise from the second signal transmission line 214.

Furthermore, according to the eighth embodiment, the slit 242 with a predetermined depth is formed in the shield layer 240 to correspond to locations between the first signal transmission line 213 and the second signal transmission line 214. Therefore, the two contact points 104l and 105m can be provided as power feed portion in the cellular telephone device 1, and it is possible to supply electric power in a state in which the contact point 104l and the contact point 105m are less subjected to high frequency noise from the second signal transmission line 214.

EXPLANATION OF REFERENCE NUMERALS 1 cellular telephone device (communication device)
2 operation unit side housing (first housing)
3 display unit side housing (second housing)
70 circuit board (first circuit board)
75 reference electric potential pattern layer (first conductive portion)
80 circuit board (second circuit board)
86 reference electric potential pattern layer (second conductive portion)
101 FPC (signal line)
104 contact point (power feed portion)
106 RF circuit portion (circuit portion)
210 signal wire (signal transmission unit)
240 shield layer (shield portion)

The invention claimed is:

1. A communication device comprising:
a first housing;
a second housing;
a first circuit board disposed in the first housing;
a second circuit board disposed in the second housing;
a circuit portion that is formed on the first circuit board, and includes a grounding portion, an power feed portion, and a signal processing unit electrically connected to the power feed portion;
a first conductive portion that is disposed in the first housing and is electrically connected with the grounding portion;
a second conductive portion that is disposed in the second housing; and
a signal line that electrically connects the first circuit board with the second circuit board, wherein the signal line includes a signal transmission unit that transmits a predetermined signal and a shield portion that shields the signal transmission unit electrically, and wherein the shield portion is electrically connected with the power feed portion in the first housing and is electrically connected with the second conductive portion in the second housing, wherein the signal line includes a first shield portion and a second shield portion that sandwich the signal transmission unit wherein the first shield portion and the second shield portion are electrically connected with the power feed portion in the first housing, and are electrically connected with the second conductive portion in the second housing, and wherein the communication device further comprises a second selector unit that is configured so as to be able to select either one of a first state in which the first shield portion is electrically connected with the power feed portion in the first housing and is electrically connected with the second conductive portion in the second housing, and a second state in which the second shield portion is electrically connected with the power feed portion in the first housing and is electrically connected with the second conductive portion in the second housing.

2. The communication device according to claim 1, wherein the shield portion has a plurality of contact points, and the communication device further comprises:

a first selector unit that is configured to be able to select a connection state electrically connecting one contact point among the plurality of contact points with the power feed portion; and a first control unit that controls selection of the connection state by the first selector unit.

3. The communication device according to claim 2, further comprising:

a connection unit that connects the first housing with the second housing to be relatively movable; and a detection unit that detects a relative movement state of the first housing and the second housing via the connection unit, wherein the first control unit controls selection of the connection state by the first selector unit in accordance with the relative movement state of the first housing and the second housing detected by the detection unit.

4. The communication device according to claim 3, wherein the detection unit detects a closed state in which the first housing and the second housing are arranged to overlap each other, an opened state in which the first housing and the second housing are arranged not to overlap each other, and an intermediate state between the closed state and the opened state, as the relative movement state.

5. The communication device according to claim 2, further comprising a function executing unit that executes a function based on a signal resonated by the second conductive portion, wherein the first control unit controls selection of the connection state by the first selector unit in accordance with a frequency of a signal resonated by the second conductive portion and is a basis for a function executed by the function executing unit.

6. The communication device according to claim 5, wherein the function executing unit includes a tuner unit and a decoder unit, the tuner unit receives a signal resonated by the second conductive portion as abroadcast wave, and the decoder unit decodes the broadcast wave received by the tuner unit.

7. The communication device according to claim 1, wherein the length of the first conductive portion in the length direction of the first housing is substantially the same as the length obtained by the sum of the length of the second conductive portion in the length direction of the second housing and the length of a transmission path in the shield portion through which a signal resonated by the second conductive portion passes through.

8. The communication device according to claim 1, wherein the first conductive portion is a first reference potential pattern that is formed on the first circuit board.

9. The communication device according to claim 1, wherein the second conductive portion is a second reference potential pattern that is formed on the second circuit board.

10. The communication device according to claim 1, wherein the first shield portion is configured in a first shape that resonates with a first frequency band, and wherein the second shield portion is configured in a second shape that resonates with a second frequency band.

11. The communication device according to claim 1, wherein the signal transmission unit includes a signal transmission line that transmits a signal and a ground line that is electrically connected with a reference electric potential, and wherein the shield portion is electrically connected with the power feed portion proximal to the ground line in the first housing.

12. The communication device according to claim 11, wherein a groove with a predetermined depth is formed in the shield portion to correspond to a location between the signal transmission line and the ground line.

13. The communication device according to claim 1, wherein the signal transmission unit includes a first signal transmission line that transmits a signal at a first transmission rate and a second signal transmission line that transmits a signal at a second transmission rate that is faster than the first transmission rate, and wherein the shield portion is electrically connected with the power feed portion more proximal to the first signal transmission line than to the second signal transmission line in the first housing.

14. The communication device according to claim 13, wherein a groove with a predetermined depth is formed in the shield portion to correspond to a location between the first signal transmission line and the second signal transmission line.

15. The communication device according to claim 1, wherein the second selector unit causes a shield layer of a back side surface to function as an antenna element during a call.

* * * * *